(12) United States Patent
Miya et al.

(10) Patent No.: US 6,419,997 B1
(45) Date of Patent: *Jul. 16, 2002

(54) GUIDE BUSH AND METHOD OF FORMING HARD CARBON FILM OVER THE INNER SURFACE OF THE GUIDE BUSH

(75) Inventors: Yukio Miya, Kawagoe; Osamu Sugiyama, Hanno; Ryota Koike, Tokorozawa; Takashi Toida; Sosaku Kimura, both of Tokyo; Kunihiko Kokubo, Kawagoe, all of (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/514,896

(22) Filed: Feb. 28, 2000

Related U.S. Application Data

(62) Division of application No. 08/913,187, filed as application No. PCT/JP96/00580 on Mar. 8, 1996.

(30) Foreign Application Priority Data

| Mar. 9, 1995 | (JP) | ............................................. 7-049473 |
| Jun. 23, 1995 | (JP) | ............................................. 7-157276 |
| Oct. 3, 1995 | (JP) | ............................................. 7-256060 |
| Nov. 1, 1995 | (JP) | ............................................. 7-284710 |

(51) Int. Cl.⁷ ............................................. C23C 16/26
(52) U.S. Cl. ..................... 427/577; 427/237; 427/238; 427/239; 427/249.1; 427/249.7
(58) Field of Search ................. 427/577, 237, 427/238, 239, 249.1, 249.7

(56) References Cited

U.S. PATENT DOCUMENTS

| 1,900,922 | A | * | 3/1933 | Evans ........................ 279/43.6 |
| 4,746,538 | A | * | 5/1988 | Mackowski | |
| 5,366,298 | A | * | 11/1994 | Toshimitsu et al. .......... 384/107 |
| 5,455,081 | A | * | 10/1995 | Okada et al. ................. 427/528 |
| 5,688,557 | A | * | 11/1997 | Lemelson et al. ........... 427/249 |
| 5,786,570 | A | * | 7/1998 | Miya et al. ................... 219/469 |
| 5,873,657 | A | * | 2/1999 | Lee ............................. 384/110 |
| 5,879,763 | A | * | 3/1999 | Sugiyama et al. ........... 427/577 |
| 5,922,418 | A | * | 7/1999 | Koike et al. ................. 427/577 |
| 5,939,152 | A | * | 8/1999 | Sugiyama et al. ........... 427/577 |

FOREIGN PATENT DOCUMENTS

| EP | 0596819 A | 11/1994 |
| JP | 07088709 | 1/1991 |
| JP | 3-138370 | 6/1991 |
| JP | 4-141303 | 5/1992 |
| JP | 6-200377 | 7/1994 |
| JP | 6-60404 | 8/1994 |

* cited by examiner

Primary Examiner—Timothy Meeks
(74) Attorney, Agent, or Firm—Armstrong, Westerman & Hattori, LLP

(57) ABSTRACT

A hard carbon film (15) is formed directly or through an intermediate layer for enhancing adhesion over an inner surface (11b) of a guide bush (11) for holding a workpiece (51) rotatably and axially slidable on an automatic lathe at a position near a cutting tool, to be in sliding contact with the workpiece (51) or directly or through an intermediate layer for enhancing adhesion on the surface of a superhard lining fixed to the inner surface (11b). The guide bush (11) has remarkably enhanced durability and prevents damaging the workpiece (51) and seizing that makes a machining operation impossible even when the guide bush (11) is used for an extended period of time and when the automatic lathe operates for heavy machining. The hard carbon film (15) having satisfactory adhesion to the inner surface (11b) can be efficiently formed in a uniform thickness over the inner surface (11b) by placing the guide bush (11) in a vacuum vessel, extending an auxiliary electrode in the center bore of the guide bush (11) and producing a plasma of a gas containing carbon.

16 Claims, 15 Drawing Sheets

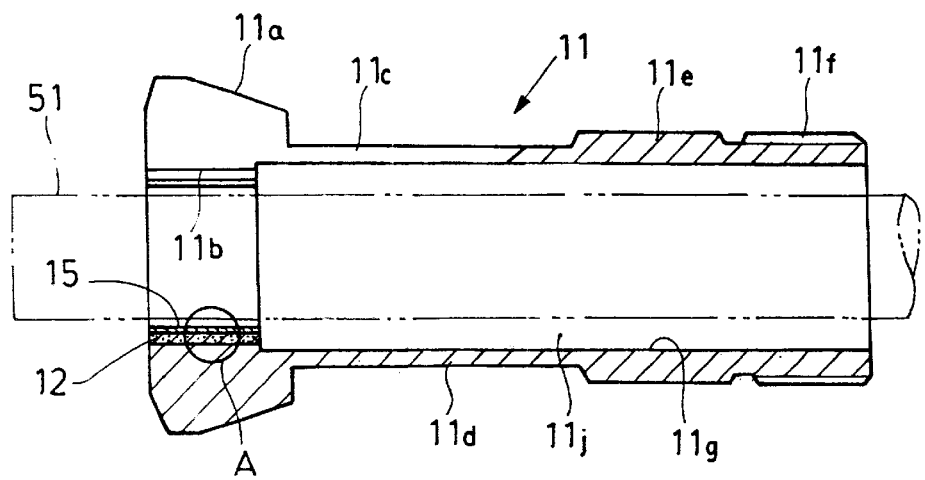
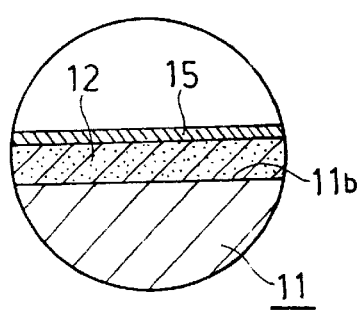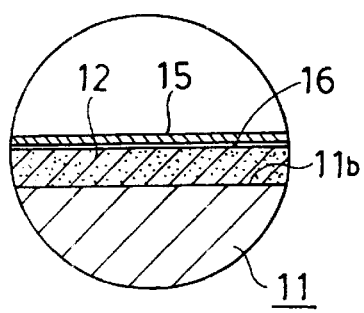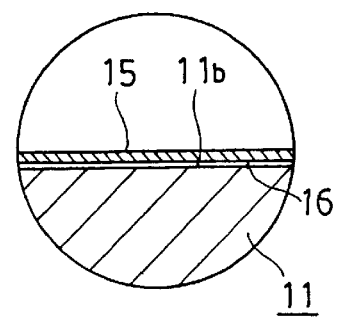
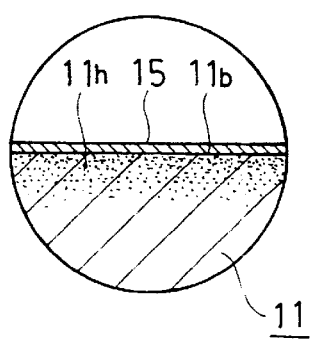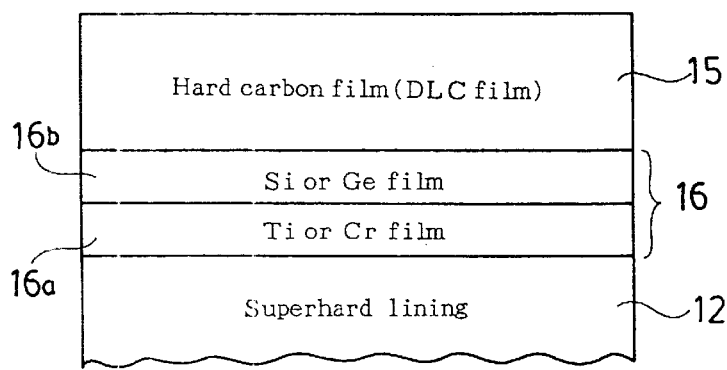

FIG.9

| | Depth of cut (d) | Cemented carbide | Ceramic material | DLC |
|---|---|---|---|---|
| Light machining | d = 0.8 mm | ✕ (n = 1) | ◯ | ◯ |
| Practical machining | d = 3.0 mm | | ✕ (n = 1) | ◯ |
| Heavy machining | d = 5.0 mm | | | ◯ |
| Critical machining | d = 6.5 mm | | | ◯ (n=100) Not abraded |

GUIDE BUSH AND METHOD OF FORMING HARD CARBON FILM OVER THE INNER SURFACE OF THE GUIDE BUSH

This application is a division of prior application Ser. No. 08/913,187 filed Sep. 8, 1997, which is a national stage application under §371 of international application PCT/JP96/00580 filed Mar. 8,1996.

TECHNICAL FIELD

The present invention relates to a guide bush included in an automatic lathe to support a rodlike workpiece for rotation and axial sliding at a position near a cutting tool (cutter), and a method of forming a hard carbon film over the inner surface of the guide bush to be in sliding contact with the workpiece.

BACKGROUND TECHNOLOGY

Guide bushes mounted on the column of an automatic lathe to hold a rodlike workpiece for rotation at a position near a cutting tool are classified into rotary guide bushes and stationary guide bushes. A rotary guide bush rotates together with a workpiece and holds the workpiece for axial sliding. A stationary guide bush remains stationary and holds a workpiece for rotation and axial sliding.

A guide bush of either type has a portion having a taper outer surface provided with slits to make the same portion elastic, a threaded portion to hold the guide bush on the column, and an inner surface for holding a workpiece. The inner surface always in sliding contact with a workpiece is liable to be worn and, particularly, the inner surface of a stationary guide bush is worn rapidly.

A guide bush proposed in JP-A No. 4-141303 has an inner surface to be in sliding contact with a workpiece, which slides and rotates on the inner surface, attached with a cemented carbide (super hard alloy sleeve) or a ceramic material attached to the inner surface by brazing or the like.

When the inner surface of a guide bush is attached with a cemented carbide or a ceramic material excellent in wear resistance and heat resistance, the wear of the inner surface of the guide bush can be reduced to some extent.

However, when the workpiece is subjected to heavy machining on an automatic lathe, in which the depth of cut is large and the cutting speed is high, the workpiece is damaged or seizing occurs due to decrease in the diametrical clearance between the guide bush and the workpiece even if the inner surface of the guide bush is attached with a cemented carbide or a ceramic material, because the cemented carbide and the ceramic material have comparatively a large coefficient of friction and a low thermal conductivity. Therefore, it has been difficult to increase the depth of cut and cutting speed.

The stationary guide bush has advantages that a workpiece can be accurately machined in a high roundness because the workpiece can be held so that its axis may not run out, less noise is generated, the automatic lathe may be of a simple, compact construction.

However, the inner surface of the stationary guide bush is worn far more rapidly than that of the rotary guide bush and hence it is more difficult to increase depth of cut and cutting speed when the stationary guide bush is employed.

Accordingly, it is an object of the present invention to provide a guide bush capable of solving such problems, having an inner surface to be in contact with a workpiece, having improved wear resistance, and capable of enabling an automatic lathe to machine a workpiece at an increased depth of cut and an increased cutting speed without damaging the workpiece or causing seizure between the guide bush and the workpiece. Another object of the present invention is to provide a method of efficiently manufacturing such a guide bush.

DISCLOSURE OF THE INVENTION

With the foregoing object in view, the present invention provides a guide bush of an approximate cylindrical form having a center bore formed along its center axis, which includes a taper outer surface formed on one longitudinal end portion and provided with slits to make the end portion elastic, a threaded portion formed on the other end portion to be mounted on the column of an automatic lathe, and an inner surface for holding a workpiece inside a portion on which the taper outer surface is formed. The guide bush is mounted on an automatic lathe so as to hold a workpiece inserted into the center bore with the inner surface for holding the workpiece rotatably and axially slidable at a position near a cutting tool, and is provided with a hard film coated on the inner surface for hold the workpiece.

Further, the present invention also provides having an inner surface to be in contact with a workpiece, coated with a hard carbon film, and a method of uniformly and firmly forming the hard carbon film in a short time over the inner surface of the guide bush.

The hard carbon film is formed of a hydrogenated amorphous carbon closely resembling diamond in properties. Therefore, hydrogenated amorphous carbon is also called diamondlike carbon (DLC).

The hard carbon film (DLC film) has a high hardness (not lower than Vickers 3000 Hv), is excellent in wear resistance and corrosion. resistance, and has a small coefficient of friction (about ⅛ that of a cemented carbide).

The guide bush of the present invention having an inner surface to be in sliding contact with a workpiece, coated with the hard carbon film, has wear resistance more excellent than the conventional guide bush having an inner surface attached with a cemented carbide or a ceramic material.

Accordingly, an automatic lathe employing the stationary guide bush of the present invention is able to achieve heavy machining, in which depth of cut is large and cutting speed is high, with high accuracy for an extended period of time without damaging the workpiece and causing seizure.

Preferably, the hard carbon film is formed on an intermediate layer formed over the inner surface of the guide bush to enhance the adhesion between the inner surface and the hard carbon film.

When the intermediate layer is formed of a two-layer film consisting of a lower layer of titanium, chromium or a compound containing titanium or chromium, and an upper layer of silicon, germanium or a compound containing silicon or germanium, the lower layer secures adhesion to the inner surface (carbon tool steel) of the guide bush, and the upper layer bonds firmly to the hard carbon film. Therefore, the hard carbon film adheres firmly to the inner surface of the guide bush with a high adhesion.

The hard carbon film may be formed on a hard lining member of a cemented carbide, such as tungsten carbide (WC), or a sintered ceramic material, such as silicon carbide (SiC), formed on the inner surface of the guide bush. An intermediate layer interposed between such a hard lining member and the hard carbon film will further enhance the adhesion of the hard carbon film.

A carburized layer may be formed in the inner surface of the guide bush at a portion of the substrate in the vicinity thereof and the hard carbon film may be formed over the carburized inner surface. When an intermediate layer similar to that mentioned above is formed between the carburized inner surface and the hard carbon film, the adhesion of the hard carbon film can be enhanced.

A method of forming a hard carbon film over the inner surface of a guide bush in accordance with the present invention comprises the following steps.

A guide bush for use on an automatic lathe is placed in a vacuum vessel provided with a gas inlet port and a evacuation port, and provided therein with an anode and a filament, and then an auxiliary electrode having the shape of a rod or a wire is inserted in the center bore of the guide bush defined by the inner surface, to be in sliding contact with a workpiece. The auxiliary electrode may be inserted in the center bore of the guide bush prior to placing the guide bush in the vacuum vessel.

A process gas containing carbon is supplied through the gas inlet port into the vacuum vessel after evacuating the vacuum vessel, and a hard carbon film is formed over the inner surface of the guide bush by applying a DC voltage to the guide bush, a DC voltage to the anode and an AC voltage to the filament for producing plasma.

The plasma may be produced in the vacuum vessel by applying a radio frequency voltage or a DC voltage to the guide bush without using the anode and the filament.

A hard carbon film of a uniform film thickness can be rapidly formed over the entire inner surface of the guide bush from the open end through the depth by supplying the process gas containing carbon into the vacuum vessel and producing the plasma after placing the guide bush provided with the auxiliary electrode inserted in the center bore thereof in the vacuum vessel.

The auxiliary electrode may be insulated to keep the auxiliary electrode at a floating potential during hard carbon film formation. It is desirable to keep the auxiliary electrode at a ground potential or a positive DC potential.

The homogeneity of a portion of the hard carbon film formed in a portion of the inner surface near the open end of the guide bush can be improved by disposing a ringlike dummy member having an inside diameter approximately equal to the diameter of the inner surface of the guide bush near the end surface of the open end portion of the guide bush provided with slits when forming the hard carbon film.

When the dummy member is used, it is desirable to dispose the auxiliary electrode with its extremity extended into the dummy.

The homogeneity of a portion of the hard carbon film formed in a portion of the inner surface near the open end of the guide bush and a portion of the same near the slits can be improved by disposing a ringlike jig provided with a plurality of projections capable of being inserted in the slits of the guide bush near the slitted open end portion of the guide bush and combining the ringlike jig and the guide bush with the projections of the ringlike jig inserted in the slits of the guide bush during hard carbon film formation.

The homogeneity of a portion of the hard carbon film formed in a portion of the inner surface near a stepped portion of a diameter greater than that of a portion of the inner surface to be in sliding contact with a workpiece can be improved by inserting a cylindrical plug-in jig having an inside diameter approximately equal to that of the portion of the inner surface to be in sliding contact with a workpiece during hard carbon film formation.

By the use of both the ringlike jig provided with the projections and the cylindrical plug-in jig in combination with the guide bush for hard carbon formation, a hard carbon film homogeneous over the entire inner surface can be formed.

The auxiliary electrode can be easily supported in the center bore of the guide bush in alignment with the center axis of the guide bush by supporting the auxiliary electrode on an insulator member inserted in the stepped portion of an increased diameter of the inner surface, and an optional voltage can be easily applied to the auxiliary electrode.

BRIEF DESCRIPTION OF THE DRAWINGS

FIG. 3 is a longitudinal sectional view of a guide bush in another embodiment according to the present invention;

FIGS. 4 to 7 are enlarged sectional views of portions A surrounded by circles in FIGS. 1 and 3;

FIG. 8 is a typical enlarged sectional view of a portion of FIG. 6, for assistance in explaining the construction of an intermediate layer;

FIG. 9 is a table comparatively showing results of cutting tests conducted by using a guide bush of the present invention and conventional guide bushes on an automatic lathe provided with a stationary guide bush unit;

BEST MODE FOR CARRYING OUT THE INVENTION

Preferred embodiments of the present invention will be described hereinafter.

Automatic Lathe Employing Guide Bush in Accordance with the Present Invention

The construction of an automatic lathe employing a guide bush in accordance with the present invention will be briefly described.

Figure 29:
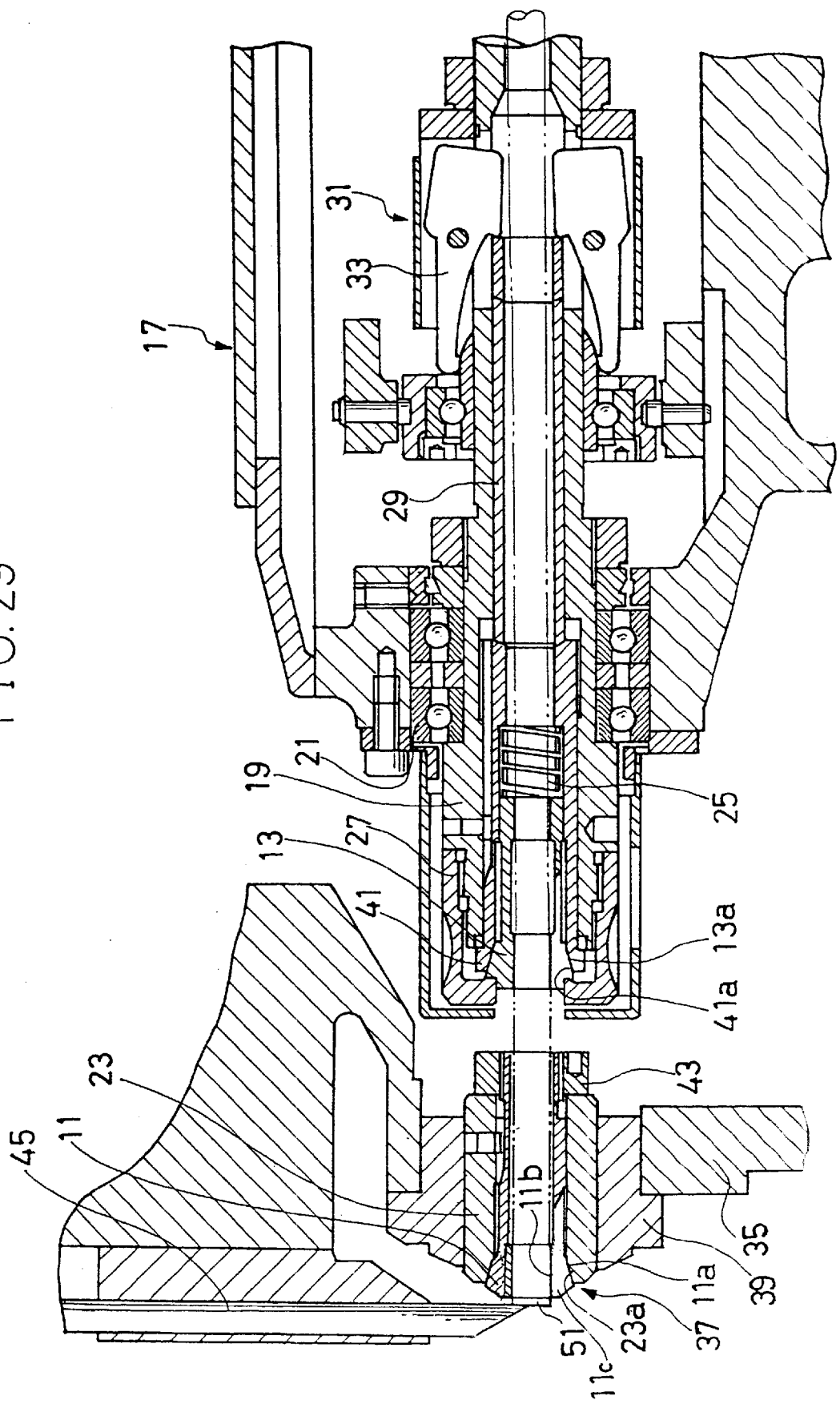
FIG. 29 is a sectional view of a spindle and associated parts included in an automatic lathe provided with a stationary guide bush unit employing a guide bush in accordance with the present invention.

Referring to FIG. 29 showing only a spindle and associated parts of a numerically controlled automatic lathe in a sectional view. The automatic lathe is provided with a stationary guide bush unit 37 that holds a guide bush 11 fixedly to support a workpiece 51 (indicated by imaginary lines) rotatably on the inner surface 11b of the guide bush 11.

A spindle stock 17 is mounted on the bed, not shown, of the numerically controlled automatic lathe for sliding movement in transverse directions, as viewed in FIG. 29.

A spindle 19 is supported for rotation in bearings 21 on the spindle stock 17, and a collet chuck 13 is mounted on the nose of the spindle 19.

The collet chuck 13 having a coned head having a taper outer surface 13a is inserted in the center bore of a chucking sleeve 41 with the taper outer surface 13a in close contact with a taper inner surface 41a formed in a front portion of the chucking sleeve 41.

A coil spring 25 formed by winding a spring band is inserted in an intermediate sleeve 29 at the back end of the collet chuck 13. The collet chuck 13 can be pushed out of the intermediate sleeve 29 by the action of the coil spring 25.

The position of the front end of the collet chuck 13 is determined by a cap nut 27 fastened to the front end of the spindle 19 with screws and in contact with the front end of the collet chuck 13. The cap nut 27 restrains the collet chuck 13 from being pushed out of the intermediate sleeve 29 by the force of the coil spring 25.

A chuck operating mechanism 31 provided with chuck operating levers 33 is provided on the back end of the intermediate sleeve 29. The chuck operating levers 33 are operated to open or close the collet chuck 13 so that the collet chuck 13 releases or chucks the workpiece 51.

When the chuck operating levers 33 of chuck operating mechanism 31 are turned so that the front ends thereof are moved away from each other, operating portions of the chuck operating levers 33 in contact with the intermediate sleeve 29 move to the left, as viewed in FIG. 29 to push the intermediate sleeve 29 to the left. Consequently, the chucking sleeve 41 in contact with the left end of the intermediate sleeve 29 moves to the left.

The collet chuck 13 is restrained from being pushed out of the spindle 19 by the cap nut 27 fastened to the front end of the spindle 19 with screws.

Therefore, when the chucking sleeve 41 is moved to the left, the taper inner surface 41a of the chucking sleeve 41 is pressed against the taper outer surface 13a of the slitted, coned head portion of the collet chuck 13 and the taper inner surface 41a of the chucking sleeve 41 moves to the left along the taper outer surface 13a of the collet chuck 13.

Consequently, collet chuck 13 is compressed and the inside diameter of the collet chuck 13 is reduced to grip the workpiece 51.

When releasing the workpiece 51 from the collet chuck 13 by expanding the collet chuck 13 so that the inside diameter of the collet chuck 13 is increased, the chuck operating levers 33 are turned so that the front ends thereof are moved toward each other to remove the force acting to the left on the chucking sleeve 41.

Then, the intermediate sleeve 29 and the chucking sleeve 41 are moved to the right as viewed in FIG. 29 by the stored energy of the coil spring 25.

Consequently, the pressure applied to the taper outer surface 13a of the collet chuck 13 by the taper inner surface 41a of the chucking sleeve 41 is removed to allow the collet chuck 13 to expand by its own resilience, so that the inside diameter of the collet chuck 13 increases to release the workpiece 51.

A column 35 is disposed in front of the spindle stock 17 and the guide bush unit 37 is placed on the column 35 with its center axis aligned with that of the spindle.

The guide bush unit 37 is of a stationary type fixedly holding the guide bush 11 to support the workpiece 51 rotatably on the inner surface 11b of the guide bush 11.

A bush sleeve 23 is fitted in the center bore of a holder 39 fixed to the column 35. A taper inner surface 23a is formed in the front portion of the bush sleeve 23.

The guide bush 11 having a front portion provided with a taper outer surface 11a and slits 11c are fitted in the center bore of the bush sleeve 23.

The clearance between the inner surface of the guide bush 11 and the outer surface of the workpiece 51 can be adjusted by turning an adjusting nut 43 screwed on the threaded portion of the guide bush 11 and contiguous with the back end of the guide bush unit 37.

When the adjusting nut 43 is turned clockwise, the guide bush 11 moves to the right, as viewed in FIG. 29, relative to the bush sleeve 23 and the taper outer surface 11a of the guide bush 11, similarly to the taper outer surface of the collet chuck 13, is compressed by the taper inner surface 23a of the bush sleeve 23 and the inside diameter of the slitted front portion of the guide bush 11 is reduced.

A cutting tool (cutter) 45 is disposed in further front of the guide bush unit 37.

The workpiece 51 is chucked by the collet chuck 13 mounted on the spindle 19 and supported by the guide bush unit 37. A portion of the workpiece 51 projecting from the guide bush unit 37 into a machining region is machined for predetermined machining by a combined motion of the cross feed motion of the cutting tool 45 and the longitudinal traverse motion of the spindle stock 17.

Figure 30:
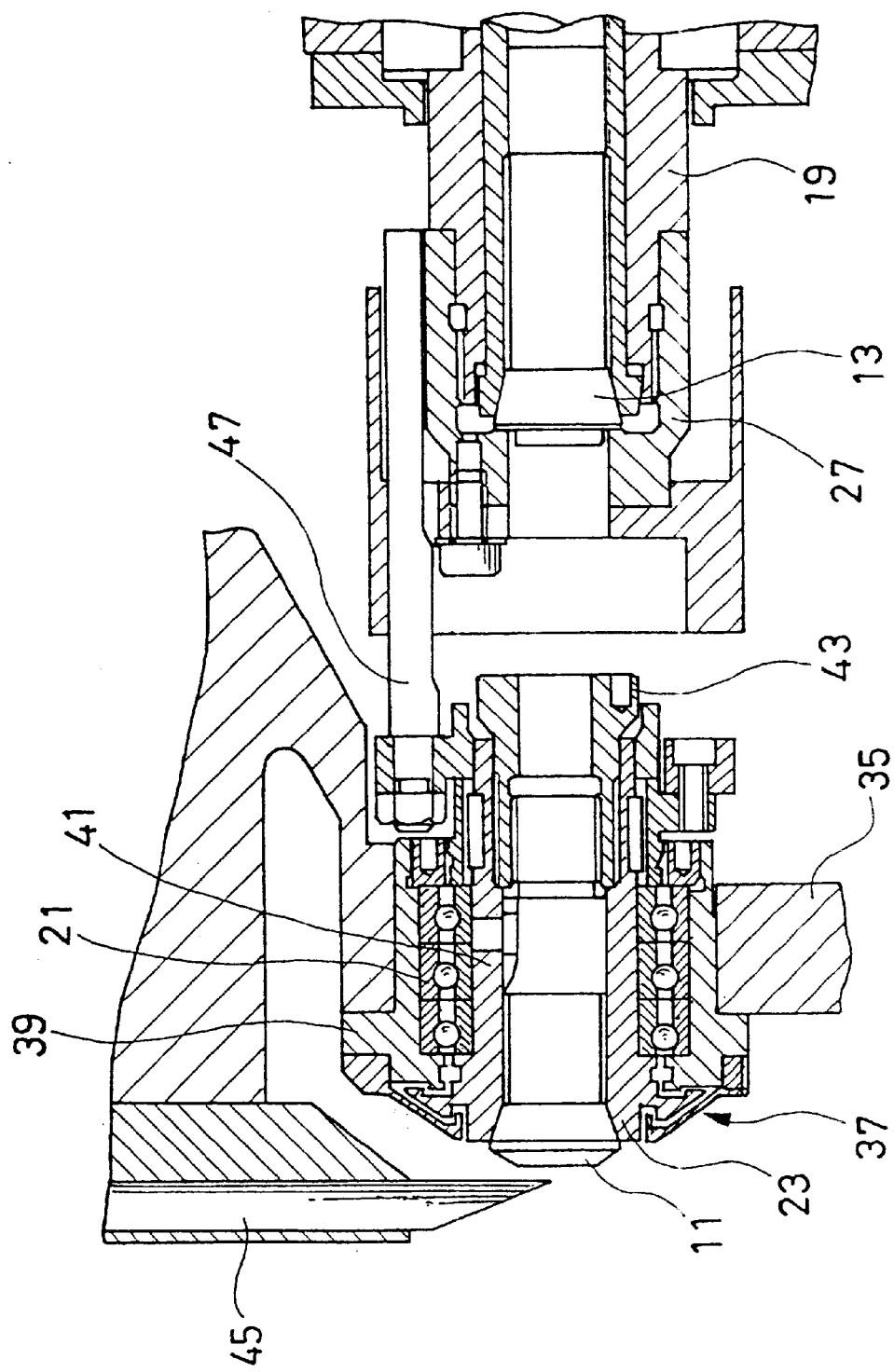
FIG. 30 is a sectional view of a spindle and associated parts included in an automatic lathe provided with a rotary guide bush unit employing a guide bush in accordance with the present invention.

A rotary guide bush unit that supports rotatably a guide bush gripping a workpiece will be described with reference to FIG. 30, in which parts like or corresponding to those shown in FIG. 29 are designated by the same reference characters.

Rotary guide bush units are classified into those holding a guide bush 11 so as to rotate in synchronism with the collet chuck 13 and those holding a guide bush 11 so as to rotate in asynchronism with the collet chuck 13. A guide bush unit 37 shown in FIG. 30 holds the guide bush 11 so as to rotate in synchronism with the collet chuck 13.

The rotary guide bush unit 37 is driven by a drive rod 47 projecting from the cap nut 27 mounted on the spindle 19. A gear mechanism or a belt-and-pulley mechanism may be used instead of the drive rod 47 for driving the guide bush unit 37.

The rotary guide bush unit 37 has a holder 39 fixed to a column 35. A bush sleeve 23 is inserted in the center bore of the holder 39 and is supported in bearings 21 on the holder 39, and the guide bush 11 is fitted in the center bore of the bush sleeve 23.

The bush sleeve 23 and the guide bush 11 are similar in construction to those illustrated in FIG. 29, respectively. The clearance between the inner surface of the guide bush 11 and the outer surface of the workpiece 51 can be adjusted by turning an adjusting nut 43 screwed on the threaded portion of the guide bush 11 which is contiguous with the back end of the guide bush unit 37.

This automatic lathe is the same in construction as the automatic lathe illustrated in FIG. 29 except that this automatic lathe is provided with the rotary guide bush unit 37, and hence the further description thereof will be omitted.

Guide Bush In Accordance with the Present Invention

Guide bushes in preferred embodiments according to the present invention will be described hereinafter.

Figure 1:
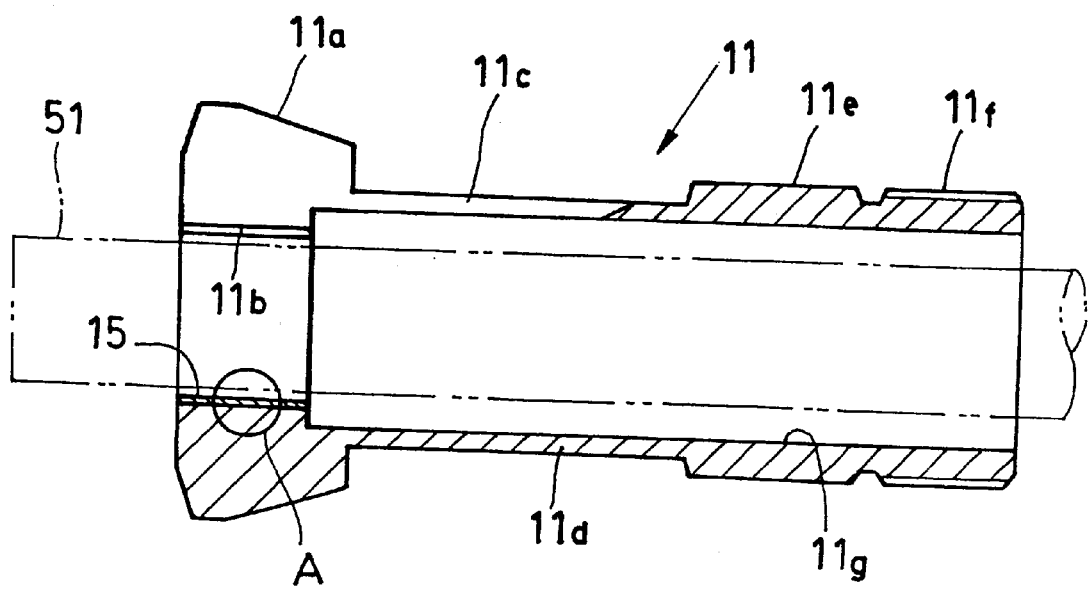
FIG. 1 is a longitudinal sectional view of a guide bush in a preferred embodiment according to the present invention.
Figure 2:
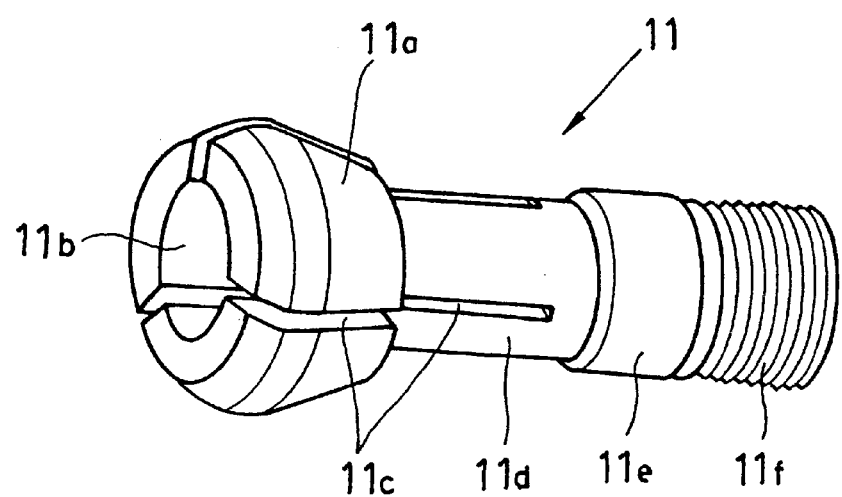
FIG. 2 is a perspective view of the guide bush of FIG. 1.

FIGS. 1 and 2 are a longitudinal sectional view and a perspective view, respectively, of a guide bush in a preferred embodiment according to the present invention.

Referring to FIGS. 1 and 2, a guide bush 11 is shown in a free state in which a front end portion is open. The guide bush has a head portion having a taper outer surface 11a in one longitudinal end thereof, a threaded portion 11f in the other longitudinal end thereof.

Further, the guide bush has a stepped center bore formed along its center axis and having a reduced section having an inner surface 11b that holds a workpiece 51 and an expanded section 11g having a diameter greater than that of the reduced section. The reduced section of the center bore is formed in the head portion.

Three slits 11c are formed at angular intervals of 120° so as to extend through the head portion having the taper outer surface 11a and an elastic bendable portion 11d.

The clearance between the inner surface 11b and the workpiece 51 indicated by imaginary lines in FIG. 1 can be adjusted by pressing the taper outer surface 11a of the guide bush 11 by the taper inner surface of the bush sleeve, so that the elastic bendable portion 11d is bent.

The guide bush 11 has a fitting portion lie between the elastic bendable portion 11d and the threaded portion 11f. When the guide bush 11 is fitted in the center bore of the bush sleeve 23 (FIGS. 29 and 30), the fitting portion 11e fits the center bore closely to set the guide bush 11 with its axis in alignment with the center axis of the spindle.

The guide bush 11 is made of a carbon tool steel (SK steel). When forming the guide bush 11, a workpiece of carbon tool steel is machined in predetermined external and internal shapes, and the machined workpiece is subjected to quenching and annealing.

Preferably, a superhard lining 12 is attached to the inner surface 11b of the guide bush 11 as shown in FIG. 3 by brazing.

When the head portion having the taper outer surface 11a is compressed, a clearance in the range of 5 to 10 $\mu$m is formed between the inner surface 11b and the workpiece 51 in the radial direction thereof to allow the workpiece 51 to slide relative to the guide bush 11, which abrades the inner surface 11b.

When the guide bush 11 is used on a stationary guide bush unit, the workpiece 51 supported on the guide bush 11 rotates at a high surface speed relative to the inner surface 11b and, when an excessively high pressure is applied to the inner surface 11b by the workpiece 51, seizing may occur.

Therefore, the inner surface 11b of the guide bush 11 is coated with a hard carbon film (DLC film) 15 of a thickness in the range of 1 to 5 $\mu$m.

In an example shown in FIG. 1, the hard carbon film 15 is formed on an intermediate layer, which will be described later, formed on the substrate (carbon tool steel) of the guide bush 11. In an example shown in FIG. 3, the hard carbon film 15 is formed on the superhard lining 12 or on an intermediate layer formed on the superhard lining 12.

The hard carbon film is very similar in properties to diamond; the hard carbon has a high mechanical strength, a small coefficient of friction, a satisfactory self-lubricity, a satisfactory electrical insulation characteristic, a high thermal conductivity and an excellent corrosion resistance.

The hard carbon film 15 covering the inner surface 11b enhances the wear resistance of the guide bush remarkably, the guide bush 11 withstands an extended period of use and heavy machining, the wear of the inner surface 11b in contact with the workpiece 51 is reduced, the possibility of exerting abrasive damage to the workpiece 51 is reduced, and seizing between the guide bush 11 and the workpiece 51 can be avoided.

Accordingly, the guide bush 11 of the present invention is capable of serving an extended period of use with remarkable improved reliability while properly functioning on the stationary guide bush unit.

Various structures of layers formed on the inner surface 11b of the guide bush 11 provided with the hard carbon film 15 will be described hereinafter with reference to FIGS. 4 to 7 showing portions A of surrounded circles in FIGS. 1 and 3 in enlarged view, and FIG. 8 showing a portion an intermediate layer shown in FIG. 6 in an enlarged view.

Referring to FIG. 4 showing a portion A in FIG. 1 in an enlarged view, an intermediate layer 16 for enhancing adhesion is formed on the inner surface 11b (carbon tool steel) of the guide bush 11, and a hard carbon film of a thickness in the range of 1 to 5 $\mu$m is formed on the intermediate layer 16. If the substrate of the guide bush 11 permits, the hard carbon film may be formed directly on the inner surface 11b and the intermediate layer 16 may be omitted.

Referring to FIGS. 5 and 6 showing a portion A in FIG. 3 in enlarged views, a superhard lining 12 of a thickness in the range of 2 to 5 mm is attached to the inner surface 11b of the substrate of the guide bush 11 by brazing or the like, and the hard carbon film 15 is formed on the inner surface of the superhard lining 12. This construction further enhances the durability of the guide bush 11.

In the example shown in FIG. 5, an intermediate layer 16 is interposed between the superhard lining 12 and the hard carbon film 15 to further enhance the adhesion.

In these examples, the superhard lining 12 underlying the hard carbon film 15 may be made of a cemented carbide, such as tungsten carbide (WC), or a sintered ceramic material, such as silicon carbide (SiC). Generally, Cr, Ni or Co is added as a binder to a material for producing the sintered ceramic material. The hard carbon film 15 may be formed directly on the superhard lining 12 and the intermediate layer 16 may be omitted when the binder content of the material is small.

A method of making the super hard lining 12 of silicon carbide (SiC) will be described by way of example.

Silicon carbide powder having a silicon (Si) to carbon (C) ratio in atomic percentage of 1 to 1 is molded by pressure molding using a pressure in the range of 0.5 to 3 t in a mold having a ringlike cavity to obtain a ringlike silicon carbide molding. Then, the ringlike silicon carbide molding is baked in an atmosphere of an inert gas, such as argon gas.

The baked molding is heated under pressure at a temperature in the range of 1400 to 1700° C., i.e., a temperature near the melting point of silicon carbide to remove pinholes from the baked silicon carbide molding. The pressure heating process increases the density of the baked silicon carbide molding to complete a product as the superhard lining 12 having a Vickers hardness in the range of 2000 to 3000 Hv.

Then, the ringlike superhard lining 12 is coated with a metal film of a material containing titanium (Ti) as a principal component by metallizing. The superhard lining 12 is placed on the inner surface 11b of the guide bush 11, and the guide bush 11 is subjected to a heat treatment process to melt the metal film so that the superhard lining 12 is bonded to the substrate of the guide bush 11.

Then, the inner surface of the superhard lining 12 is ground, and the slits 11c are formed in the guide bush 11.

An example of the guide bush 11 shown in FIG. 7 has a carburized layer 11h formed by carburizing the inner surface 11b of the substrate at a portion of the substrate in the vicinity thereof instead of the superhard lining 12, and the hard carbon film 15 formed on the carburized inner surface 11b. Carburization is one generally known surface hardening process that hardens a surface layer of a ferrous alloy maintaining the high toughness of the ferrous alloy.

In this example, the guide bush 11 is carburized in an atmosphere of a mixed gas of a carbonaceous gas, such as methane ($CH_4$) or ethylene ($C_2H_4$) and nitrogen gas ($N_2$) as a carrier gas under the following conditions

| Carburizing Conditions | |
|---|---|
| Temperature | 1100° C. |
| Time | 30 min |
| Depth of carburization | 0.5 mm |

When the guide bush 11 is provided with the carburized layer 11h in the surface of the inner surface 11b, the hard carbon film 15 may be formed directly on the inner surface. However, it is preferable to form the hard carbon film 15 on an intermediate layer 16 formed on the inner surface 11b to enhance the adhesion.

The intermediate layer 16 may be formed of an element of group IV in the periodic table of elements, such as silicon (Si) or germanium (Ge), a compound containing silicon or germanium, or a compound containing carbon, such as a silicon carbide (SiC) or titanium carbide (TiC).

The intermediate layer 16 may be formed of a compound of titanium (Ti), tungsten (W), molybdenum (Mo) or tantalum (Ta) and silicon (Si).

The intermediate layer 16 may be a two-layer film consisting of a lower layer 16a of titanium (Ti) or chromium (Cr), and an upper layer 16b of silicon (Si) or germanium (Ge) as shown in FIG. 8.

The lower layer 16a of titanium or chromium enhances adhesion to the guide bush 11, and the upper layer 16b of silicon or germanium and the hard carbon film 15 form covalent bond which bonds the hard carbon film 15 firmly to the intermediate layer 16.

The intermediate layer 16 may be: a two-layer film consisting of a lower layer of a titanium or chromium compound, and an upper layer of a silicon or germanium compound; a two-layer film consisting of a lower layer of titanium or chromium, and an upper layer of a silicon or germanium compound; or a two-layer film consisting of a lower layer of titanium or chromium compound and an upper layer of silicon or germanium.

The intermediate layer 16 may be formed by a sputtering process, an ion plating process, a chemical vapor deposition (CVD) process or a metal spraying process.

When the superhard lining 12 is made of silicon carbide (SiC), the intermediate layer 16 may be omitted, because silicon carbide is a compound of silicon and carbon included in group IV of the periodic table of elements and silicon carbide and the hard carbon film 15 formed on the superhard lining 12 make covalent bonds which secure high adhesion.

FIG. 9 is a table comparatively showing results of cutting tests conducted by using a guide bush of the present invention and conventional guide bushes on an automatic lathe.

Conventional guide bushes and a guide bush of the present invention having an inner surface coated with the hard carbon film were used for actual cutting operation to evaluate the performance thereof comparatively. These test guide bushes were used on a stationary guide bush unit.

One of the conventional guide bushes had an inner surface attached with a cemented carbide (super hard alloy), the other conventional guide bush had an inner surface attached with a sintered ceramic material, and the guide bush of the present invention had an inner surface coated with an intermediate layer and a 3 μm thick hard carbon film (DLC film) formed on the intermediate layer.

The test cutting operation was conducted under the following conditions.

| Workpiece | Stainless steel rod (SUS303), 16 mm diam. | |
|---|---|---|
| Rotating speed | 4000 rpm | |
| Depth of cut | Light cutting mode: | d = 0.8 mm |
| | Practical cutting mode: | d = 3 mm |
| | Heavy cutting mode: | d = 5.0 mm |
| | Critical cutting mode: | d = 6.5 mm |

| | |
|---|---|
| Feed rate | 0.05 mm/turn |
| Length of cut | 20 mm |

In FIG. 9, blank circles indicate successful cutting and crosses indicate unsuccessful cutting.

When the conventional guide bush having an inner surface attached with the cemented carbide was used, seizing occurred between the inner surface of the guide bush and the first workpiece immediately after the cutting of the first workpiece had been started and the workpiece could not be cut even though the workpiece was cut in a light cutting mode.

Although one hundred workpieces could be normally cut in a light cutting mode when the conventional guide bush having an inner surface attached with the ceramic material was used, seizing occurred between the inner surface of the guide bush and the first workpiece immediately after the cutting of the first workpiece had been started in a practical cutting mode and the workpiece could not be cut. When the guide bush of the present invention having an inner surface coated with the hard carbon film (DLC film) was used, no seizing occurred at all, the inner surface of the guide bush was not worn at all and the DLC film did not come off at all through out the cutting of one hundred workpieces in each of the light cutting mode, the practical cutting mode, the heavy cutting mode and the critical cutting mode.

Thus the guide bush of the present invention makes cutting operations under heavy cutting conditions possible, enhances machining efficiency remarkably and ensures cutting operation with high reliability for an extended period of use.

Hard Carbon Film Forming Method over an Inner Surface of Guide Bush

A method of forming the hard carbon film over the inner surface of a guide bush, in a preferred embodiment according to the present invention will be described hereinafter.

A hard carbon film forming method will be described as applied to forming the hard carbon film (DLC film) 15 over the inner surface 11b of the guide bush 11 shown in FIG. 3.

The guide bush 11 shown in FIG. 3 is formed by machining a workpiece of a carbon tool steel (SK steel) and has the taper outer surface 11a, the elastic bendable portion 11d, the fitting portion 11e, the threaded portion 11f, the center bore 11j, the inner surface 11b formed in a portion of the center bore 11j, and an expanded section 11g of the center bore 11j, having a diameter greater than that of the inner surface 11b. The cylindrical superhard lining 12 is fixedly bonded to the inner surface 11b of the guide bush 11 by brazing.

The slits 11c are formed are formed at angular intervals of 120° so as to extend through the head portion having the taper outer surface 11a and the elastic bendable portion 11d by electric discharge machining.

The inner surface 11b, the taper outer surface 11a and the fitting portion 11e are ground to complete the guide bush 11 in a stage before forming the hard carbon film thereon.

Figure 10:
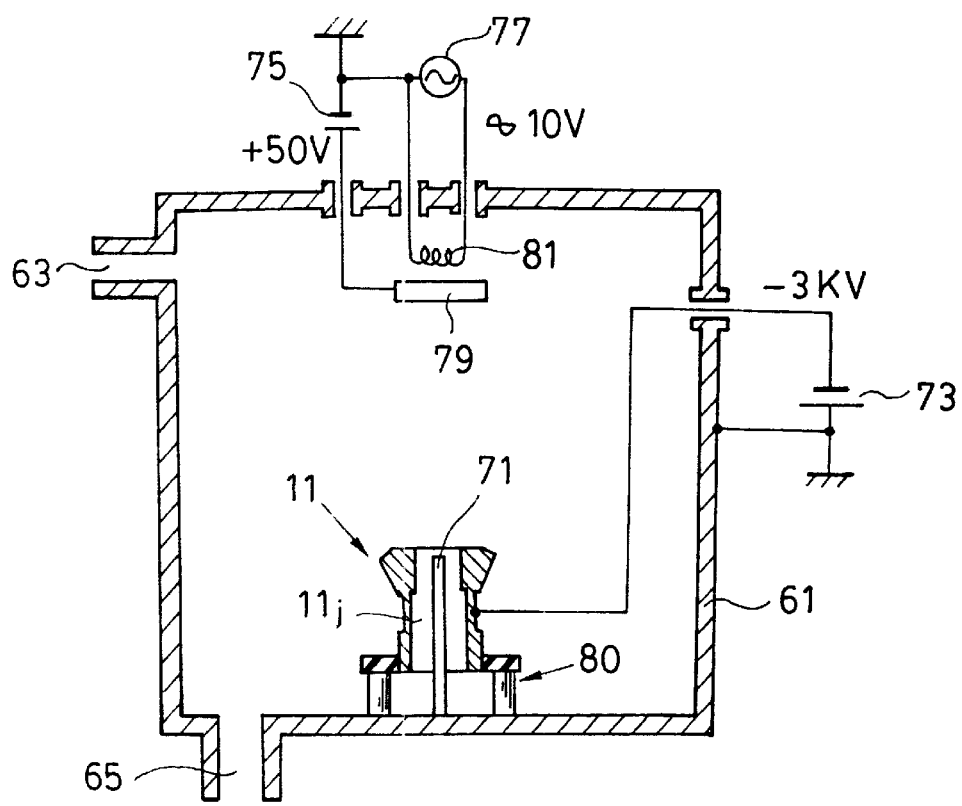
FIG. 10 is a schematic sectional view of a first hard carbon film forming apparatus for carrying out a method of forming a hard carbon film over the inner surface of a guide bush, in accordance with the present invention.

Then, the hard carbon film 15 is formed on the guide bush 11. FIG. 10 shows a first apparatus for forming the hard carbon film 15. A vacuum vessel 61 is provided with a gas inlet port 63 and a evacuation port 65. An anode 79 and a filament 81 are disposed in the upper central region of the inner space of the vacuum vessel 61. The guide bush 11 is mounted fixedly in an upright position on an insulating support 80 disposed in the lower central region of the inner space of the vacuum vessel 61.

An auxiliary electrode 71 having the shape of a thin rod is disposed in the vacuum vessel 61 so as to extend in the center bore 11j of the guide bush 11 substantially coaxially with the center bore 11j of the guide bush 11 and is connected through the vacuum vessel 61 to a ground potential.

The auxiliary electrode 71 is made of a metal, such as a stainless steel. Desirably, the extremity of the auxiliary electrode 71 is about 1 mm inside the guide bush 11 from the end face thereof, i.e., the upper end face as viewed in FIG. 10, of the guide bush 11.

The vacuum vessel 61 is evacuated to a vacuum of $3 \times 10^{-5}$ torr by sucking out gases through the evacuation port 65 from the vacuum vessel 61.

Then, benzene gas, i.e., a gas containing carbon, is supplied through the gas inlet port 63 into the vacuum vessel 61 so that the pressure in the vacuum vessel 61 is maintained at a vacuum of $5 \times 10^{-3}$ torr.

Subsequently, a negative DC voltage is applied to the guide bush 11 by a DC power source 73 and a positive DC voltage is applied to the anode 79 by an anode power source 75, and an AC voltage is applied to the filament 81 by a filament power source 77.

Then, a negative DC voltage of about −3 kV is applied to the guide bush 11 by a DC power source 73 and a positive DC voltage of about 50 V is applied to the anode 79 by an anode power source 75. And an AC voltage of about 10 V is applied to the filament 81 by a filament power source 77 so that a current of 30 A flows through the filament 81.

Thus, a plasma is produced in a region surrounding the guide bush 11 disposed within the vacuum vessel 61 to form a hard carbon film on the surface of the guide bush 11.

The hard carbon film forming method illustrated in FIG. 10 is able to produce the plasma not only around the outer surface of the guide bush but also around the inner surface of the same because the auxiliary electrode 71 is extended in the center bore 11j of the guide bush 11.

Therefore, hollow cathode discharge does not occur and the adhesion of the hard carbon film 15 is improved.

Since the distribution of potential with respect to the length of the inner surface of the guide bush 11 is uniform, the hard carbon film 15 can be formed in a uniform thickness over the inner surface 11b. Since the hard carbon film is deposited at a high deposition rate, the hard carbon film having a uniform thickness from the open end through the depth can be formed in a short time.

Figure 11:
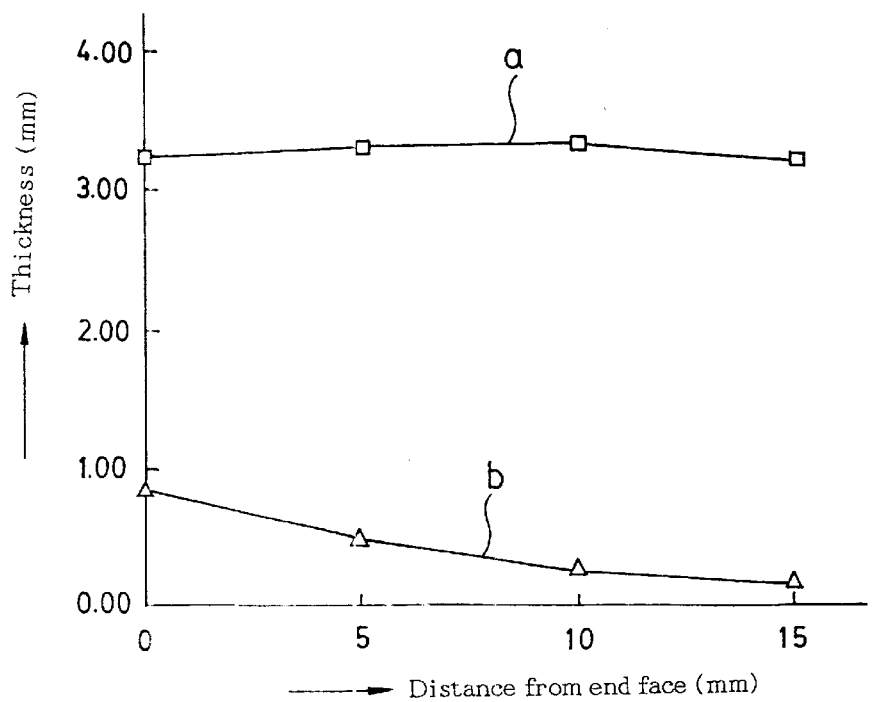
FIG. 11 is a graph showing the effect of an auxiliary electrode 71 on the dependence of the thickness of a hard carbon film on the distance from the open end of a guide bush.

FIG. 11 shows comparatively the thickness distribution of a hard carbon film formed on the guide bush 11 using the auxiliary electrode 71 and that of a hard carbon film formed on the guide bush 11 without using the auxiliary electrode 71.

When the diameter of the inner surface of the bush 11 is 12 mm and the auxiliary electrode 71 is not used, the thickness of the hard carbon film is relatively thin and the thickness of the hard carbon film decreases with the distance from the open end of the guide bush 11 as indicated by a polygonal line b, i.e., plots indicated by triangles, in FIG. 11. When the auxiliary electrode 71 is used, the thickness of the hard carbon film is large and uniform regardless of the distance from the open end as indicated by a polygonal line a, i.e., plots indicated by squares, in FIG. 11.

The auxiliary electrode 71 may be of any diameter provided that the diameter is less than the diameter of the bore of the guide bush 11. Desirably, the diameter of the auxiliary electrode 71 is determined so that a clearance of about 5 mm, i.e., a clearance for creating a plasma region, is formed between the auxiliary electrode 71 and the inner surface 11b on which the hard carbon film is formed. Desirably, the ratio of the diameter of the auxiliary electrode 71 to the diameter of the bore of the guide bush 11 is not greater than $\frac{1}{10}$. When the auxiliary electrode 71 is to be formed in a small diameter, the same may be a wire.

Although the auxiliary electrode 71 in this embodiment is formed of a stainless steel, the same may be formed of a metal having a high melting point, such as tungsten (W) or tantalum (Ta). The auxiliary electrode 71 has a circular cross section.

A hard carbon film forming method in another embodiment according to the present invention will be described hereinafter with reference to FIG. 12, in which parts like or corresponding to those shown in FIG. 10 are designated by the same reference characters and the description thereof will be omitted.

A second apparatus for carrying out the hard carbon film forming method has a vacuum vessel 61 and is not provided with any anode nor any filament.

The hard carbon film forming method using this apparatus differs from that using the apparatus shown in FIG. 10 only in that a radio frequency voltage is applied to a guide bush 11 disposed in the vacuum vessel 61 with a grounded auxiliary electrode 71 extended in the bore thereof through a matching circuit 67 by a radio frequency power source 69 of 13.56 MHz in oscillation frequency and methane gas ($CH_4$) as a gas containing carbon is supplied into the vacuum vessel 61 so that the pressure in the vacuum vessel 61 is maintained at a vacuum of 0.1 torr.

A plasma is produced around both the outer and the inner surface and a hard carbon film is formed over the entire surface of the guide bush 11. The hard carbon film 15 can be formed in a substantially uniform thickness over the entire length of the inner surface 11b shown in FIG. 3 facing the auxiliary electrode 71 in a short time.

A hard carbon film forming method in a further embodiment according to the present invention will be described with reference to FIG. 13, in which parts like or corresponding to those shown in FIG. 10 are designated by the same reference characters and the description thereof will be omitted.

A third apparatus for carrying out the hard carbon film forming method has a vacuum vessel 61 and is not provided with any anode and any filament.

The hard carbon film forming method using this apparatus differs from that using the apparatus shown in FIG. 10 only in that a DC voltage of –600 V is applied to a guide bush 11 disposed in the vacuum vessel 61 with a grounded auxiliary electrode 71 extended in the bore thereof by a DC power source 73' and methane gas ($CH_4$) as a gas containing carbon is supplied into the vacuum vessel 61 so that the pressure in the vacuum vessel 61 is maintained at a vacuum of 0.1 torr.

A plasma is produced around both the outer and the inner surface and a hard carbon film is formed over the entire surface of the guide bush 11. The hard carbon film 15 can be formed in a substantially uniform thickness over the entire length of the inner surface 11b shown in FIG. 3 facing the auxiliary electrode 71 in a short time.

Although the hard carbon film forming methods described above form the hard carbon film over both the outer and the inner surface of the guide bush 11, the hard carbon film may be formed only over the inner surface of the guide bush 11.

Figure 14:
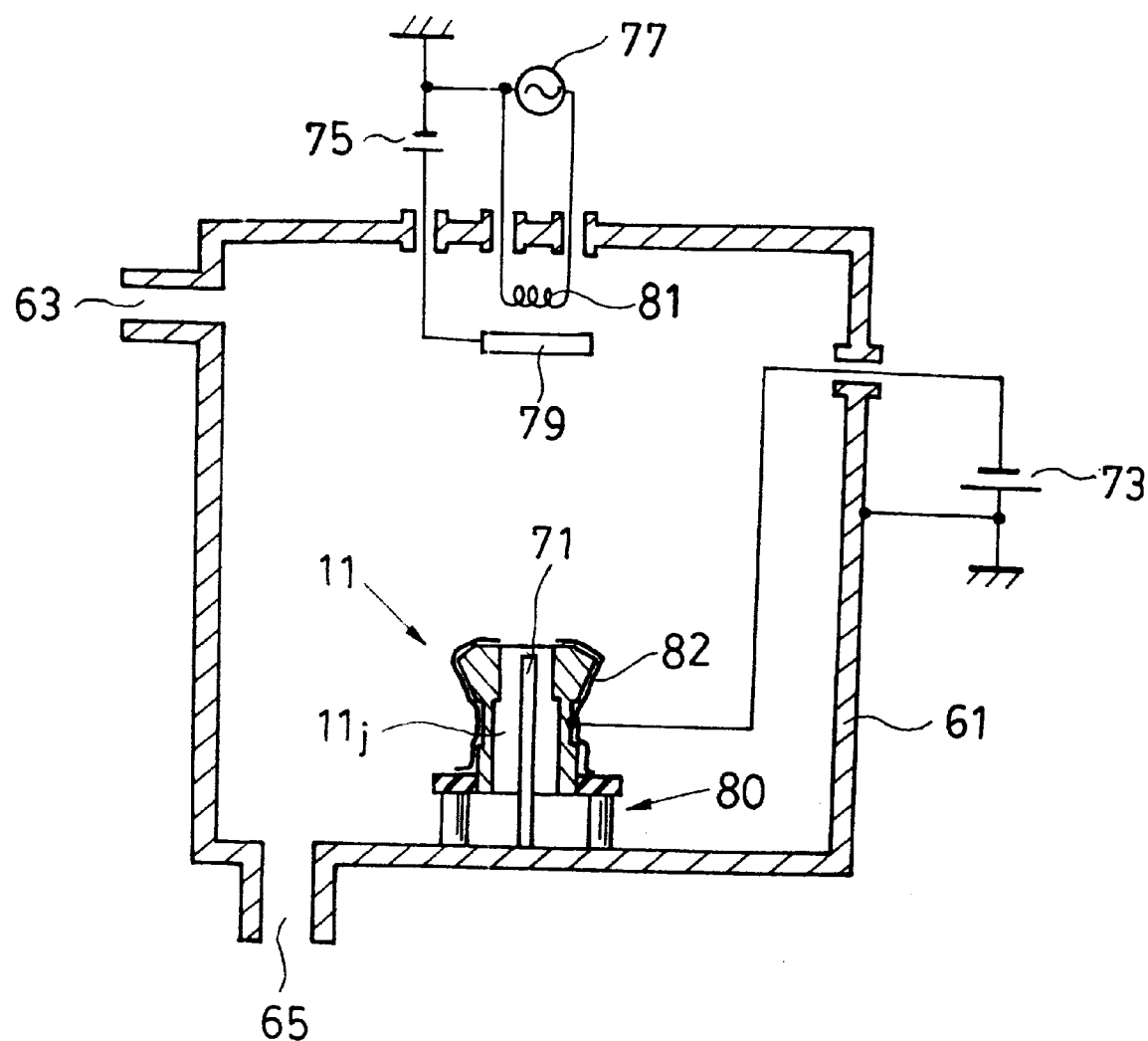
FIG. 14 is a sectional view, similar to FIG. 10, of the hard carbon film forming apparatus of FIG. 10 additionally provided with a covering member.

When it is desired to form the hard carbon film only over the inner surface of the guide bush 11, the outer surface of the guide bush 11 is covered with a covering member 82 as shown in FIG. 14. An aluminum foil may be placed around the outer surface of the guide bush 11 as a simple means for covering the outer surface of the guide bush 11.

FIG. 14 shows the guide bush 11 covered with the covering member 82 disposed in the first apparatus shown in FIG. 10. The hard carbon film having a uniform thickness can be firmly formed only over the inner surface by covering the outer surface of the guide bush 11 with the covering member 82, such as an aluminum foil when the second apparatus shown in FIG. 12 or the third apparatus shown in FIG. 13 is used.

These previously described hard carbon film forming methods are applicable to forming the hard carbon film 15 over the inner surface 11b in the foregoing layered structures described with reference to FIGS. 4 to 8.

Although the foregoing hard carbon film forming methods embodying the present invention use methane gas or benzene gas as a gas containing carbon, ethylene containing carbon or a vapor of a liquid containing carbon, such as hexane, may be used instead of methane gas or benzene gas.

Since the foregoing hard carbon film forming method embodying the present invention for forming a hard carbon film on a guide bush disposes the auxiliary electrode at a ground potential in a portion of the bore of the guide bush corresponding to the inner surface 11b over which a hard carbon film is to be formed, the auxiliary electrode at a ground potential can be interposed between the opposite inner surfaces at the same potential. Therefore, the electrodes at the same potential do not face each other and hence hollow cathode discharge, i.e., an abnormal discharge does not occur and hence a satisfactory hard carbon film can be firmly formed over the inner surface 11b of the guide bush 11.

Hard carbon film forming methods in still further embodiments according to the present invention for forming a hard carbon film over the inner surface of a guide bush will be described with reference to FIGS. 15 to 18.

Figure 12:
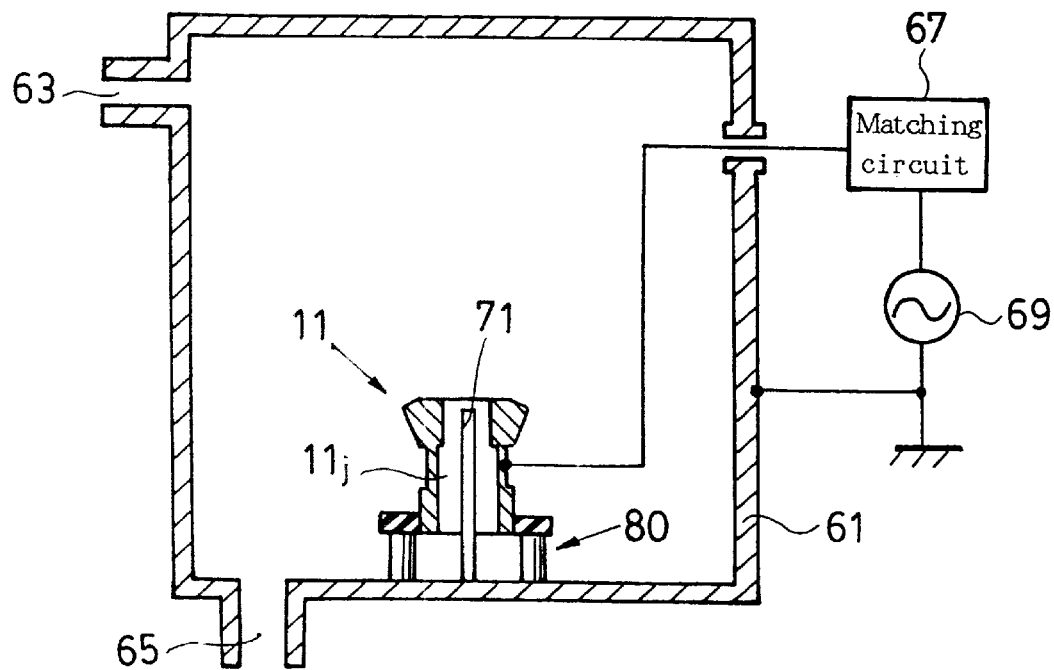
FIG. 12 is a schematic sectional view of a second hard carbon film forming apparatus for carrying out a method of forming a hard carbon film over the inner surface of a guide bush, in accordance with the present invention.
Figure 13:
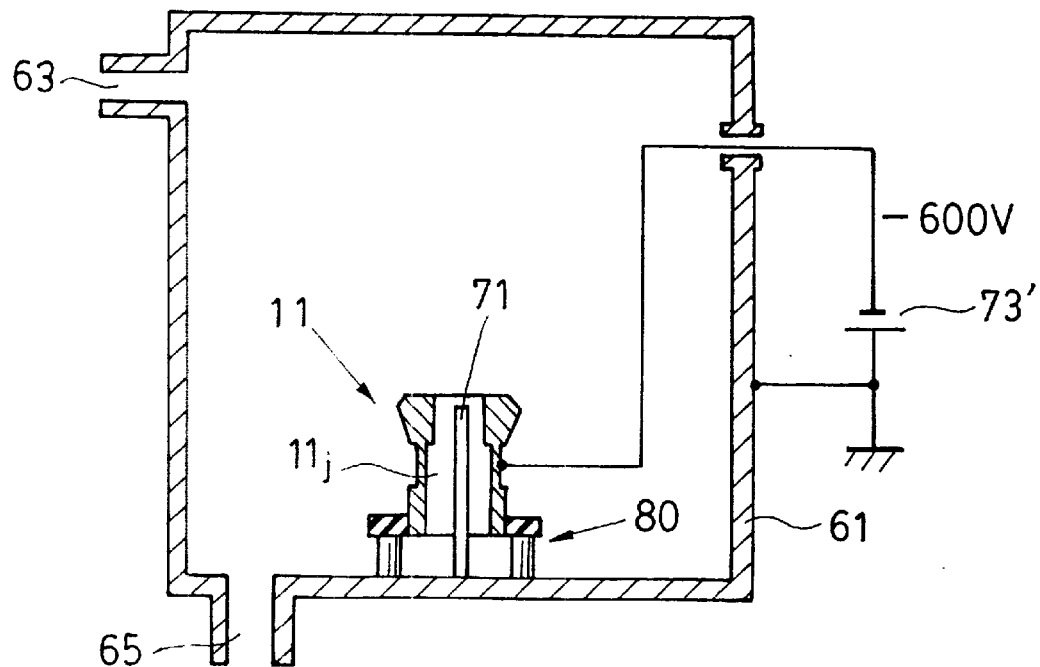
FIG. 13 is a schematic sectional view of a third hard carbon film forming apparatus for carrying out a method of forming a hard carbon film over the inner surface of a guide bush, in accordance with the present invention.
Figure 15:
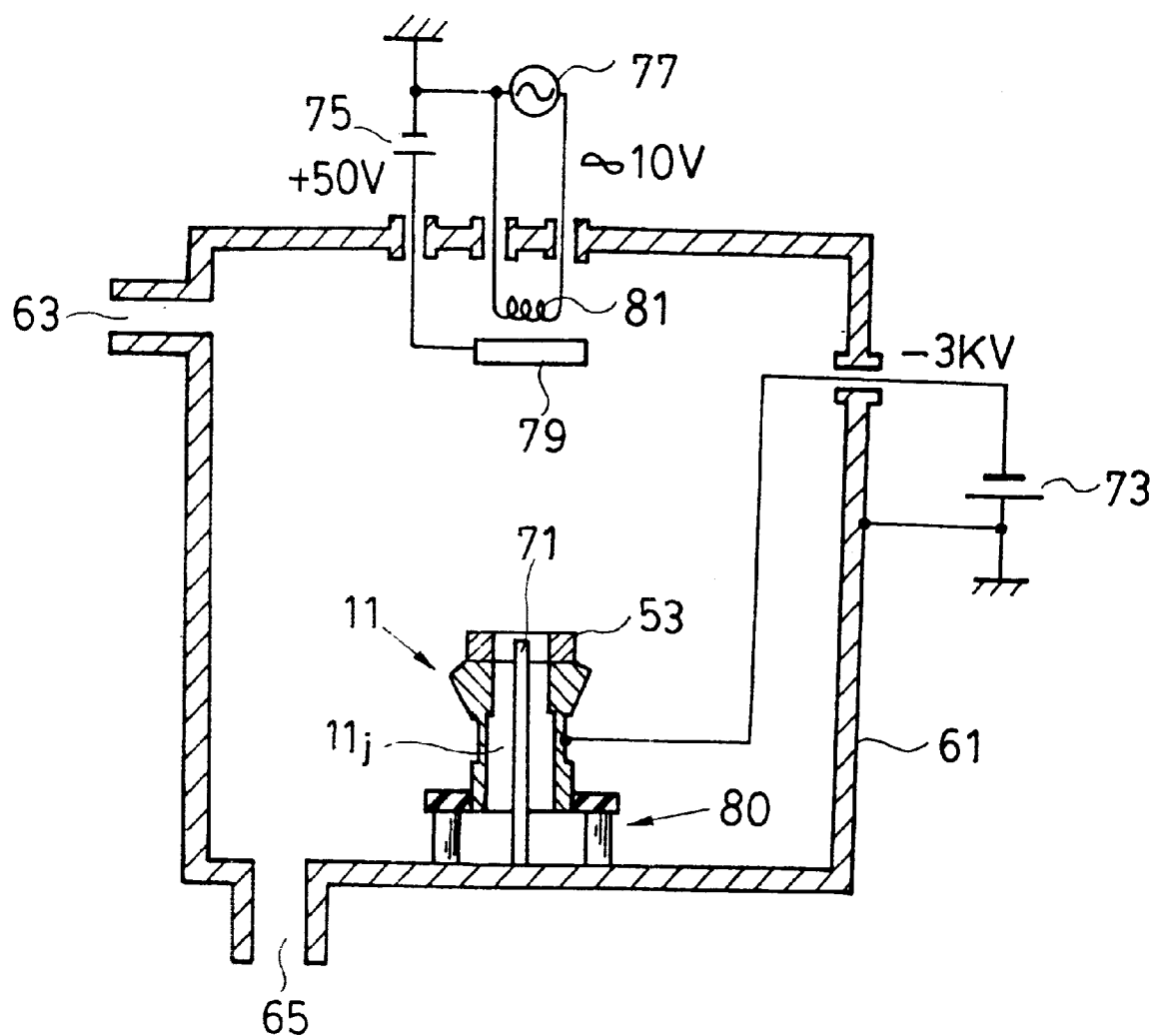
FIG. 15 is schematic sectional view, similar to FIG. 10, of a hard carbon film forming apparatus for carrying out a hard carbon film forming method in another embodiment according to the present invention.
Figure 17:
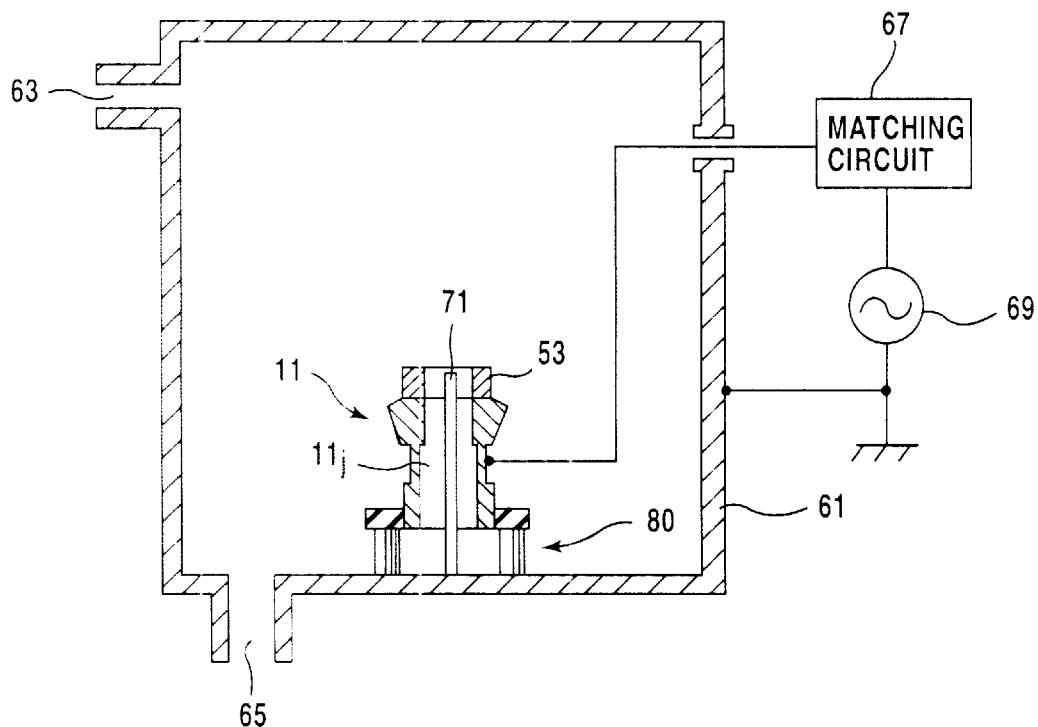
FIGS. 17 and 18 are schematic sectional views, similar to FIGS. 12 and 13, of hard carbon film forming apparatuses for carrying out a hard carbon film forming method in a further embodiment according to the present invention.
Figure 18:
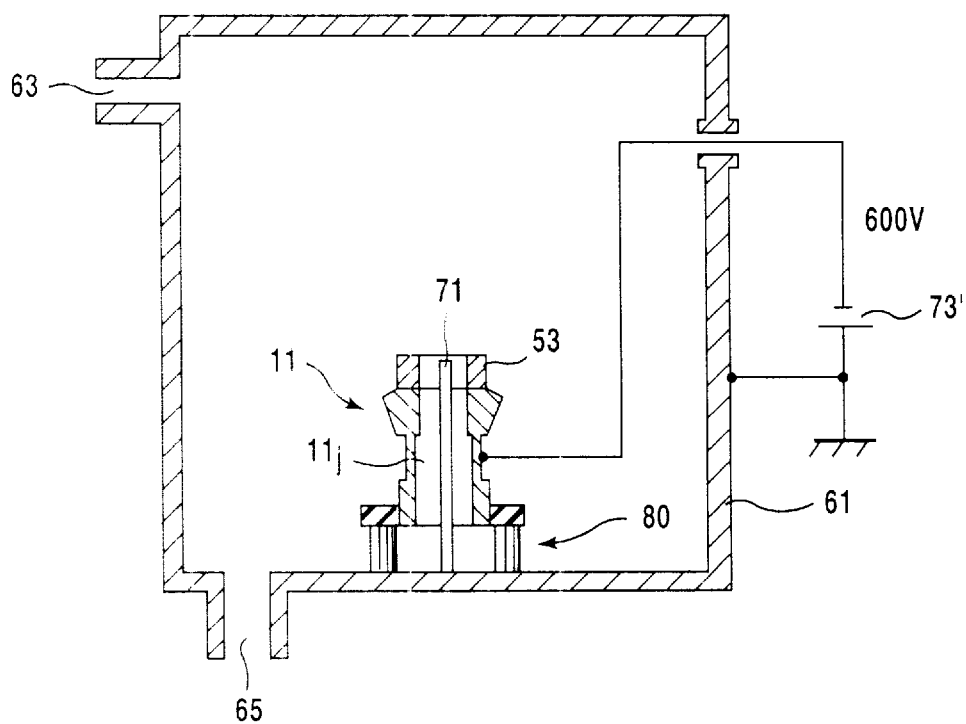

Apparatuses shown in FIGS. 15, 17 and 18 illustrate hard carbon film forming methods using the first, the second and the third apparatus shown in FIGS. 10, 12 and 13, respectively. In FIGS. 15, 17 and 18, parts like or corresponding to those shown in FIGS. 10, 12 and 13 are designated by the same reference characters and the description thereof will be omitted.

Figure 16:
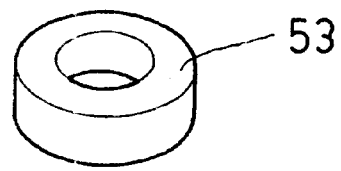
FIG. 16 is a perspective view of a dummy member employed in carrying out the hard carbon film forming method by the hard carbon film forming apparatus of FIG. 15.

These hard carbon film forming methods illustrated in FIGS. 15, 17 and 18 differ from those previously described with reference to FIGS. 10, 12 and 13, respectively, only in that a ringlike dummy member 53 as shown in FIG. 16 having an inside diameter substantially equal to the diameter of the inner surface of 11b of the guide bush 11 (FIG. 1) is employed. The dummy member 53, similarly to the auxiliary electrode 71, is formed of a stainless steel and has an outside diameter substantially equal to the outside diameter of the end surface of the guide bush 11 in which the bore of the guide bush 11 opens.

As shown in FIG. 15, the guide bush 11 on which a hard carbon film is to be formed is disposed in the vacuum vessel 61 having the gas inlet port 63 and the evacuation port 65, and the dummy member 53 is put on the end face of the guide bush 11 on the side of the taper outer surface (upper end face as viewed in FIG. 15) so that the inner surface of the guide bush 11 and that of the dummy member 53 are aligned.

As mentioned above the super hard lining is fixed to, or the intermediate layer is formed on, the inner surface 11b of the guide bush 11 beforehand. As mentioned above, the guide bush 11 is disposed in the vacuum vessel 61 with the auxiliary electrode at a ground potential extended in the center bore 11j of the guide bush 11. Preferably, the extremity of the auxiliary electrode 71 does not project from and is slightly below the upper end face of the dummy member 53.

The hard carbon forming method is the same in other respects as that previously described with reference to FIG. 10. To make sure of it, the gases prevailing in the vacuum vessel 61 are sucked out through the evacuation port 65 to evacuate the vacuum vessel 61 to a vacuum of $5 \times 10^{-5}$ torr. After thus evacuating the vacuum vessel 61, benzene gas ($C_6H_6$) as a gas containing carbon is supplied through the gas inlet port 63 into the vacuum chamber 61 so that the pressure in the vacuum vessel 61 is maintained at a vacuum of $5 \times 10^{-3}$ torr.

A DC voltage of −3 kV is applied to the guide bush 11 by the DC power source 73, a DC voltage of +50 V is applied to the anode 79 by the anode power source 75, and an AC voltage of 10 V is applied to the filament 81 by the filament power source 77 so that a current of 30 A flows through the filament 81.

Consequently, a plasma is produced in a region surrounding the guide bush 11 in the vacuum vessel 61 and a hard carbon film is formed over the surface of the guide bush 11 including the inner surface 11b shown in FIG. 1 of the guide bush 11.

The auxiliary electrode 71 functions as mentioned above, and the dummy member 53 functions as follows.

In this method for forming a hard carbon film on the guide bush 11, the plasma is produced around the inner and the outer surface of the guide bush 11. Electric charges are liable to be concentrated on the end face of the guide bush 11 and the potential of a portion of the guide bush around the end face tends to become higher than that of the inner surface due to an edge effect. Therefore, the intensity of the plasma in the vicinity of the end face of the guide bush 11 is greater than that of the plasma in the vicinity of other portions of the guide bush 11 and is unstable.

Furthermore, a portion of the guide bush 11 around the end face is subject to the influence of both the plasma produced outside the guide bush 11 and that produced inside the guide bush 11.

When a hard carbon film is formed under such conditions, the adhesion and quality of a portion of the hard carbon film formed on a portion of the inner surface in a range of several millimeters from the end face of the guide bush differ slightly from those of a portion of the same formed on other portions of the inner surface of the guide bush 11.

When the dummy member 53 is put on the end face of the guide bush 11 as shown in FIG. 15 during the hard carbon film forming process, the portion of the hard carbon film having adhesion and quality different from those of a portion of the same formed on other portions of the inner surface of the guide bush 11 is not formed on the inner surface of the guide bush 11 and is formed on the inner surface of the dummy member 53.

Experiments showed that a hard carbon film of a width in the range of 1 to 2 mm having adhesion and quality slightly different from those of a hard carbon film formed in other portions of the inner surface of the guide bush 11 was formed at a depth of about 4 mm from the end face of the guide bush 11 when the hard carbon film was formed by the hard carbon film forming method illustrated in FIG. 10.

When the dummy member 53 of 10 mm in length and an inside diameter substantially equal to that of the bore of the guide bush 11 was put on the end face of the guide bush 11 and the hard carbon film forming method was carried out under the foregoing conditions, a portion of the hard carbon film having adhesion and quality different from other portions of the hard carbon film was formed on the dummy member 53 and any such portion was not formed on the inner surface of the guide bush 11 at all.

The hard carbon film forming method illustrated in FIG. 17, similarly to the hard carbon film forming method illustrated in FIG. 12, is different from the aforesaid method only in that a radio frequency voltage is applied through the matching circuit 67 by the radio frequency power source 69 of 13.56 MHz in oscillation frequency to produce a plasma in the vacuum vessel 61, and methane gas ($CH_4$) as a gas containing carbon is supplied into the vacuum vessel 61 so that the pressure in the vacuum vessel 61 is maintained at a vacuum of 0.1 torr.

The hard carbon film forming method illustrated in FIG. 18 is different from the aforesaid method only in that a DC voltage of −600 V is applied to the guide bush 11 by the DC power source 73' to produce a plasma in the vacuum vessel 61.

These methods are able to form efficiently a hard carbon film having uniform adhesion and quality can be formed over the inner surface 11b of the guide bush 11 by using the auxiliary electrode 71 and the dummy member 53.

The hard carbon film can be formed only over the inner surface of the guide bush 11 by covering the outer surface of the guide bush with the covering member 82 as shown in FIG. 14.

When carrying out those hard carbon forming methods, the auxiliary electrode 71 is disposed so that its extremity is about 1 mm inside the dummy member 53 from the end face of the dummy member 53. Therefore abnormal discharge at the extremity of the auxiliary electrode 71 that occurs when the extremity of the auxiliary electrode 71 projects from the end face of the dummy member 53 can be avoided and the hard carbon film 15 can be formed in a satisfactory quality on the inner surface of the guide bus 11.

Hard carbon film forming methods in further preferred embodiments according to the present invention for forming a hard carbon film on a guide bush will be described with reference to FIGS. 19 to 23.

Figure 19:
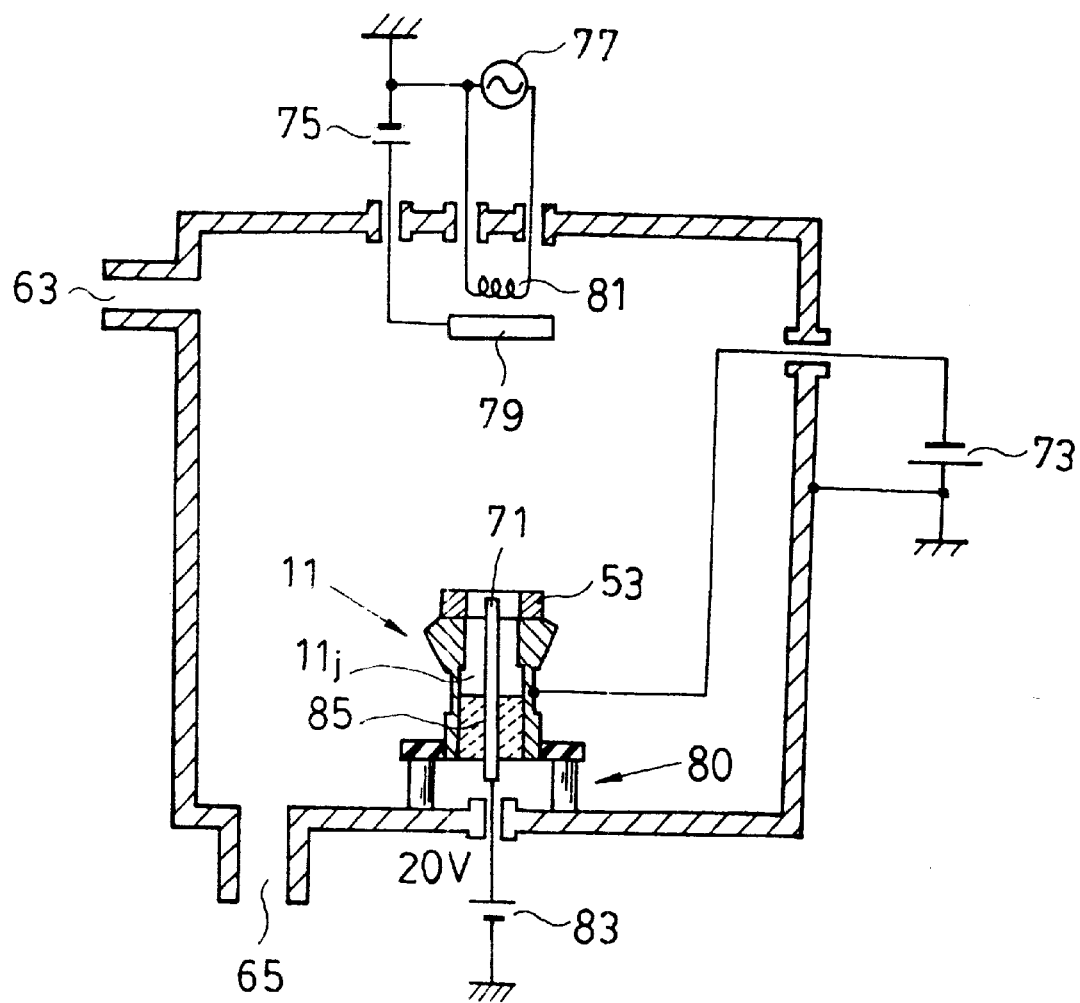
FIG. 19 is a schematic sectional view, similar to FIG. 15, of a hard carbon film forming apparatus for carrying out a hard carbon film forming method in still a further embodiment according to the present invention.
Figure 20:
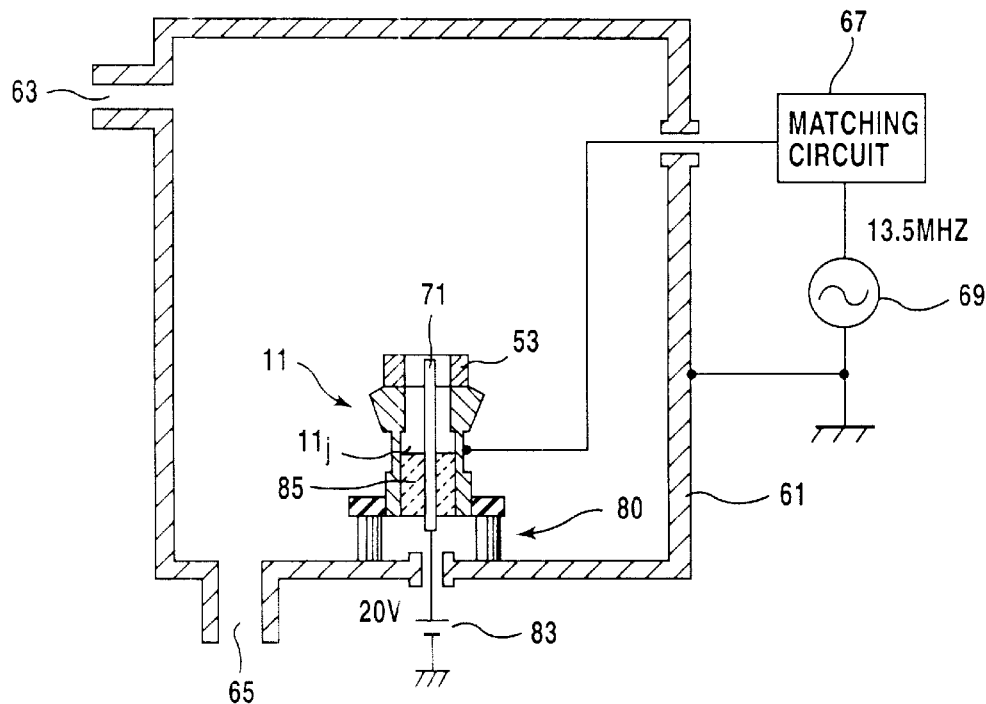
FIGS. 20 and 21 are schematic sectional views, similar to FIGS. 17 and 18, of hard carbon film forming apparatuses for carrying out a hard carbon film forming method in a preferred embodiment according to the present invention.
Figure 21:
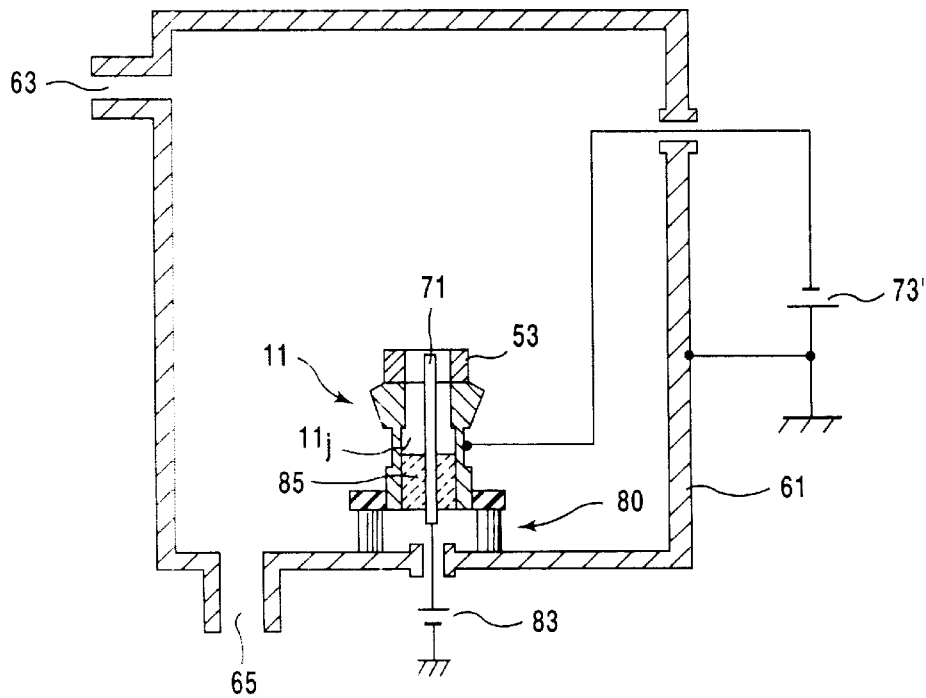

FIGS. 19 to 21 illustrate the hard carbon film forming methods, respectively. FIGS. 19 to 21 correspond to FIGS. 15, 17 and 18, respectively. In FIGS. 19 to 21, parts like or corresponding to those shown in FIGS. 15, 17 and 18 are designated by the same reference characters and the description thereof will be omitted.

These hard carbon film forming methods are different from the foregoing hard carbon film forming methods in that the auxiliary electrode 71 is supported on an insulator 85 received in the center bore 11j of a guide bush 11 so that the auxiliary electrode 71 is insulated from both the guide bush 11 and the vacuum vessel 61, and a positive DC voltage of, for example, 20 V is applied to the auxiliary electrode 71 by an auxiliary electrode power source 83.

Figure 22:
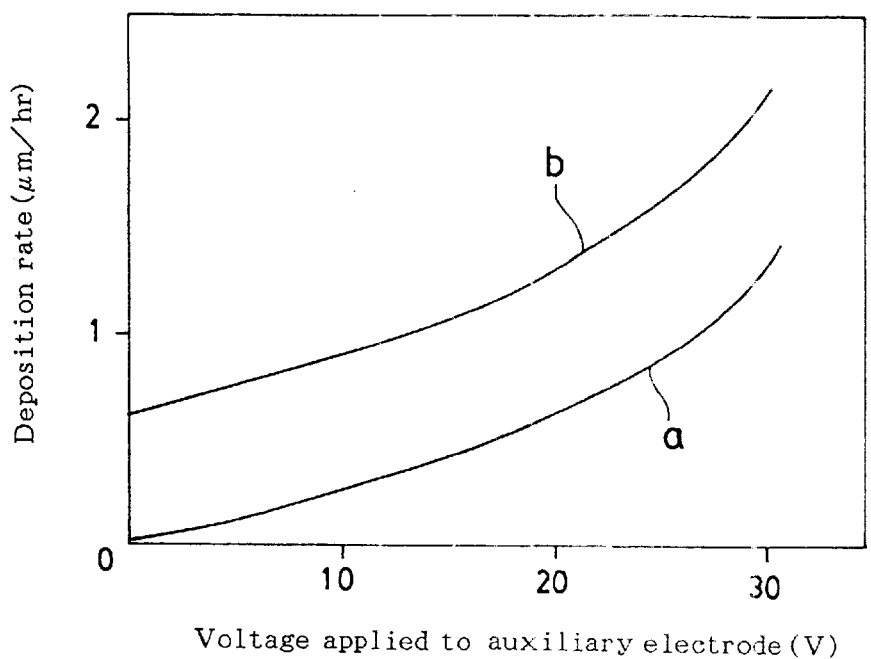
FIG. 22 is a graph showing the dependence of the thickness of a hard carbon film on DC positive voltage applied to an auxiliary electrode.

FIG. 22 shows the dependence of the thickness of a hard carbon film formed on the inner surface of the guide bush 11 on the positive voltage applied to the auxiliary electrode 71 for different clearances between the auxiliary electrode 71 and the inner surface of the guide bush 11.

The positive DC voltage was varied from 0 V to 30 V. Characteristic curves a and b are for clearance of 3 mm and 5 mm, respectively.

It is known from the curves a and b that the rate of deposition of the hard carbon film increases as the positive DC voltage applied to the auxiliary electrode 71 increases and the rate of deposition of the hard carbon film is higher when the clearance between the inner surface of the bore of the guide bush 11 and the auxiliary electrode 11 is greater.

No plasma is produced around the inner surface of the center bore 11j of the guide bush 11 nor can any hard carbon film be formed when a voltage of 0 V is applied to the auxiliary electrode 71 and the potential of the auxiliary electrode 71 is equal to the ground voltage and the clearance between the inner surface of the bore of the guide bush and the auxiliary electrode 71 is 3 mm (curve a).

A plasma is produced around the auxiliary electrode 71 within the center bore 11j of the guide bush 11 and a hard carbon film can be formed when the positive DC voltage applied to the auxiliary electrode 71 is increased even when the clearance between the inner surface of the center bore 11j and the auxiliary electrode 71 is 3 mm.

Therefore, this hard carbon film forming method that applies a positive DC voltage to the auxiliary electrode 71 is able to form a hard carbon film over the inner surface of a guide bus having a center bore 11j of a small diameter.

All the hard carbon film forming methods illustrated in FIGS. 19 to 21 have the same effect.

As described with reference to FIGS. 10 to 13, the same effect can be obtained by applying a positive DC voltage to the auxiliary electrode 71 when forming a hard carbon film without using the dummy member 53.

Figure 23:
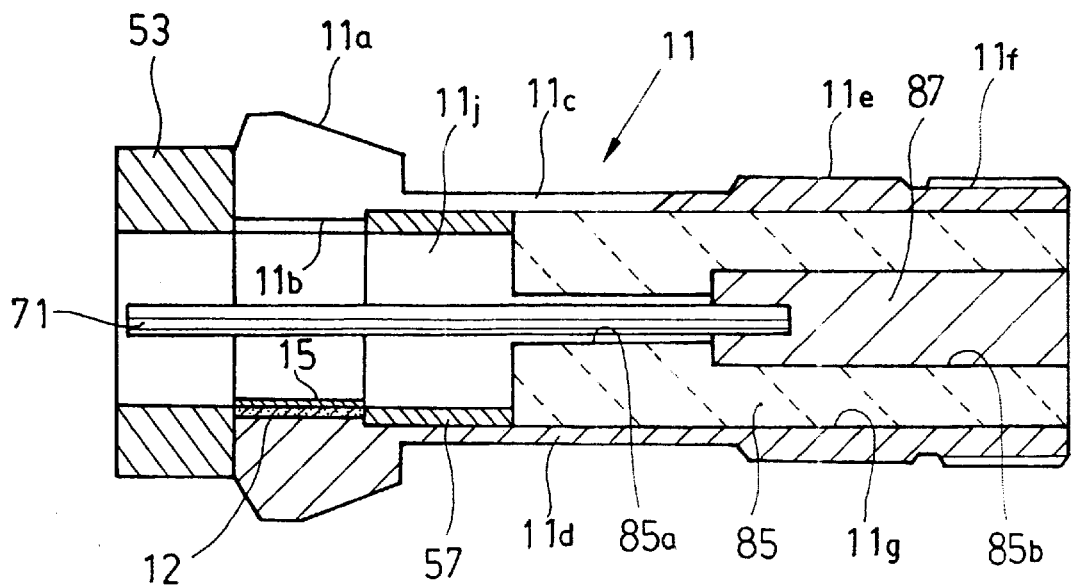
FIG. 23 is a sectional view of a concrete example of an auxiliary electrode support structure.

FIG. 23 shows a concrete example of a structure for supporting the auxiliary electrode 71 in the center bore of the guide bush 11 in an insulated state.

As shown in FIG. 23, an insulator 85 made of an insulating ceramic material is inserted in the expanded section 11g of the center bore of the guide bush 11 provided with a first center bore 85a and a second center bore 85b of a diameter different from that of the first center bore 85a. The auxiliary electrode 71 is inserted in the first center bore 85a, and a connecting electrode 87 having a comparatively large diameter and joined to the auxiliary electrode 71 is fitted in the second center bore 85b.

The respective diameters of the auxiliary electrode 71 and the first center bore 85a are determined so that a clearance in the range of 0.01 to 0.03 mm is formed between the respective surfaces of the auxiliary electrode 71 and the first center bore 85a. The respective diameters of the expanded section 11g of the guide bush 11 and the insulator 85 are determined so that a clearance in the range of 0.01 to 0.03 mm is formed between the respective surfaces of the expanded section 11g of the guide bush 11 and the insulator 85.

A cylindrical jig 57 is disposed near the inner surface 11b of the guide bush 11. The inside diameter of the cylindrical jig 57 is approximately equal to the diameter of the inner surface 11b. When the cylindrical jig 57 is held between the insulator 85 and the inner surface 11b of the guide bush 11, and the dummy member 53 is mounted on the end face of the guide bush 11, no step is formed in the vicinity of the inner surface 11b of the guide bush 11 on which the hard carbon film 15 is formed; that is a uniform clearance is formed between a portion of the center bore around the inner surface 11b over which the hard carbon film 15 is to be formed and the auxiliary electrode 71.

The auxiliary electrode 71 can be disposed in the center bore 11j of the guide bush 11 in accurate alignment with the center axis of the center bore 11j by inserting the insulator 85 supporting the auxiliary electrode 71 in the expanded section 11g of the guide bush 11.

If the auxiliary electrode 71 is out of alignment with the center axis of the center bore of the guide bush 11, an unbalanced plasma is produced in the space between the auxiliary electrode 71 and the surface of the center bore and, consequently, the hard carbon film 15 cannot be formed in a uniform thickness and a uniform quality.

The auxiliary electrode 71 can be disposed in accurate alignment with the center axis of the center bore of the guide bush 11 and the hard carbon film 15 can be formed in a uniform thickness and a uniform quality by determining the diameter of the insulator 85 so that the insulator 85 can be closely fitted in the expanded section 11g of the center bore of the guide bush 11 and adjusting the position of the auxiliary electrode 71 by the first center bore 85a of the insulator 85.

A positive DC voltage is applied through the connecting electrode 87 to the auxiliary electrode 71 when carrying out the hard carbon film forming methods previously described with reference to FIGS. 19 to 21. Since the auxiliary electrode 71 collects electrons, a plasma of a high density is formed in the center bore 11j of the guide bush 11, which enhances the rate of deposition of the hard carbon film.

The auxiliary electrode 71 is connected through the connecting electrode 87 to a ground potential when carrying out the hard carbon film forming methods previously described with reference to FIGS. 10 to 18.

A negative voltage lower than that applied to the guide bush 11 (a negative voltage about 1/10 times the voltage applied to the guide bush 11) may be applied to the auxiliary electrode 71. When such a negative voltage is applied to the auxiliary electrode 71, the motion of electrons within the center bore 11j of the guide bush 11 is intensified, whereby the density of the plasma is increased and hence the rate of deposition of the hard carbon film is enhanced.

The insulated auxiliary electrode 71 may be maintained at a floating potential. When the auxiliary electrode 71 is at a floating potential, a negative potential is produced on the auxiliary electrode 71 by the interaction between the plasma and the auxiliary electrode 71, the effect of which is equivalent to that of the application a low negative voltage to the auxiliary electrode 71.

Figure 24:
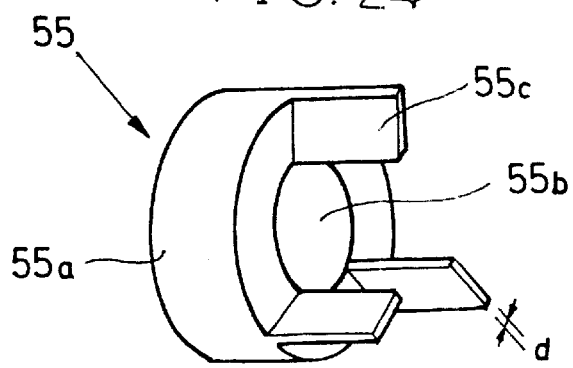
FIG. 24 is a perspective view of a ringlike jig with projections employed in carrying out a hard carbon film forming method in accordance with the present invention.

A ringlike jig having projections 55 as shown in FIG. 24 may be used instead of the dummy member 53 put on the end face of the guide bush 11 in carrying out the hard carbon film forming methods described with reference to FIGS. 10 to 23.

As shown in FIG. 24, the ringlike jig 55 has a ringlike body 55a having an opening of a diameter substantially equal to the diameter of the inner surface 11b of the guide bush 11, and three projections 55c capable of being inserted in the slits 11c of the guide bush 11, respectively, and arranged at equal angular intervals of 120°. The thickness d of the projections 11c is substantially equal to the width of the slits 11c.

The ringlike jig 55 is identical with a member formed by providing the dummy member 53 with the projections 55c.

Figure 26:
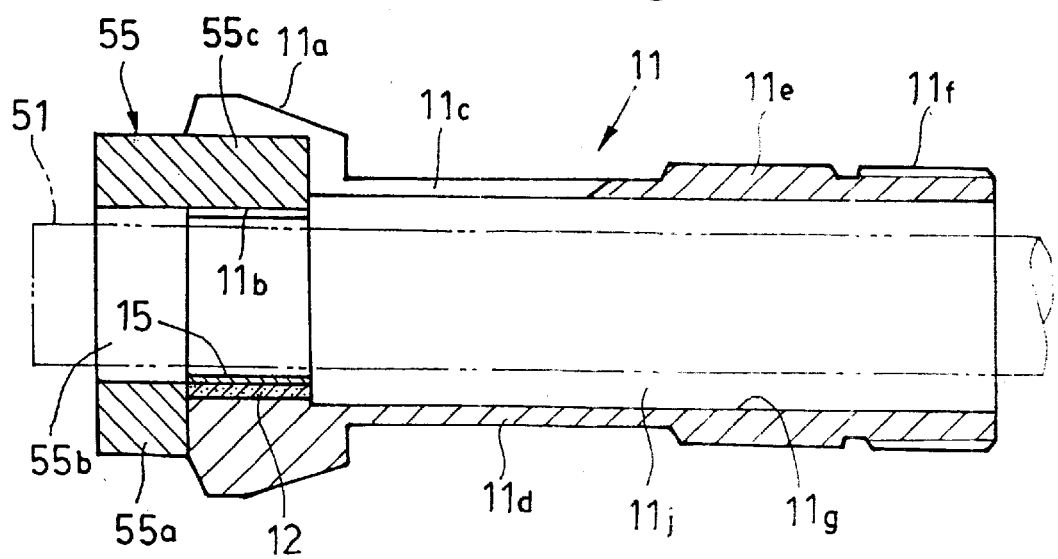
FIG. 26 is a longitudinal sectional view of a guide bush combined with the ringlike jig with projections.

The ringlike jig 55 is put on the end face of the guide bush 11 with the projections 55c inserted in the slits 11c of the guide bush 11 as shown in FIG. 26.

The foregoing methods are carried out with the ringlike jig 55 thus put on the end face of the guide bush 11 to form the hard carbon film 15 over the inner surface 11b of the guide bush 11.

The use of the ringlike jig 55 when forming the hard carbon film on the guide bush 11 provides the following effects.

As mentioned above, the quantity of charges collected around a portion of the guide bush around the end face is greater than that of charges collected around the inner surface of the guide bush due to charge concentration on the end face attributable to an edge effect. The edge effect can be suppressed when the ringlike jig 55 is put on the guide bush 11 when forming a hard carbon film on the guide bush.

Thus, local differences in thickness and quality in the hard carbon film due to edge effect can be prevented when the hard carbon film is formed on the guide bush 11 with the ringlike jig 55 put on the end face of the guide bush 11.

Since the projections 55c of the ringlike jig 55 are inserted in the slits 11c of the guide bush 11, edge effect due to the concentration of electric field on the edges of the slits 11c can be suppressed.

Consequently, the uniformity of the quality and adhesion of the hard carbon film 15 formed on the inner surface 11b of the guide bush 11 is further improved.

Figure 25:
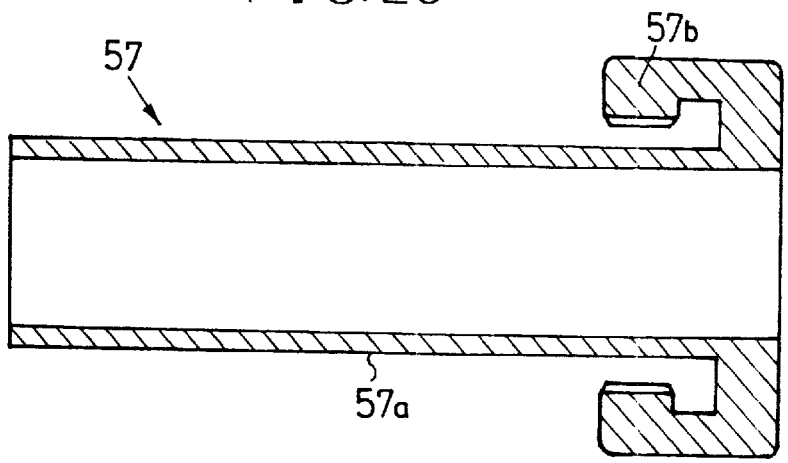
FIG. 25 is a longitudinal sectional view of a cylindrical plug-in jig.

FIG. 25 is a longitudinal sectional view of a cylindrical plug-in jig 57 to be fitted in the expanded section 11g of the center bore of the guide bush 11.

Figure 27:
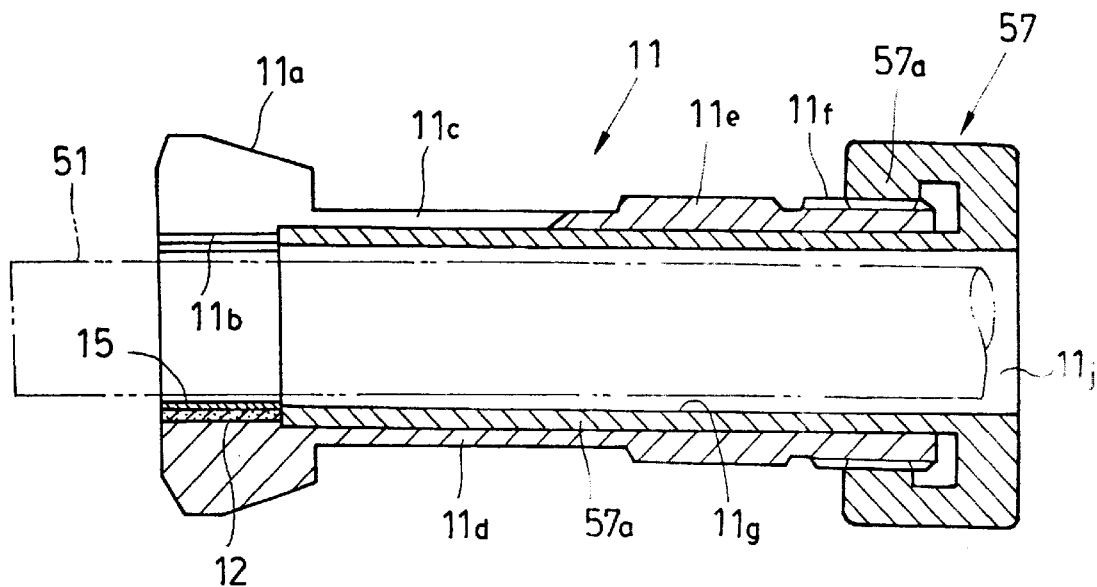
FIG. 27 is a longitudinal sectional view of a guide bush combined with the cylindrical plug-in jig.

The plug-in jig 57 has a cylindrical body 57a having an inside diameter substantially equal to the diameter of the inner surface 11b of the guide bush 11, and a threaded head 57b provided with an internal screw thread that mates with the threaded portion 11f of the guide bush 11. The outside diameter of the cylindrical body 57a is determined so that the cylindrical body 57a fits closely to the expanded section 11g of the center bore of the guide bush 11. When the cylindrical body 57a of the plug-in jig 57 is inserted in the expanded section 11g of the center bore of the guide bush 11 and the threaded head 57b is screwed on the threaded portion 11f of the guide bush 11 as shown in FIG. 27, no step is formed in the inner surface of the center bore 11j of the guide bush 11; that is the inner surface of the guide bush 11 has the same diameter throughout the entire length thereof.

When the plug-in jig 57 is thus mounted on the guide bush 11, the step between the expanded section 11g and the inner surface 11b is leveled off and, consequently, a uniform clearance is formed between the inner surface of the guide bush 11 and the auxiliary electrode 71 throughout the entire length of the guide bush 11.

The foregoing hard carbon film forming methods are able to form the hard carbon film over the inner surface 11b of the guide bush 11 with the plug-in jig 57 inserted in the guide bush 11.

When a hard carbon film is formed on the guide bush 11 using the plug-in jig 57, the potential characteristic of the inner surface of the center bore 11j of the guide bush is uniform over the entire length of the guide bush, so that the hard carbon film is uniform in thickness, adhesion and quality.

Figure 28:
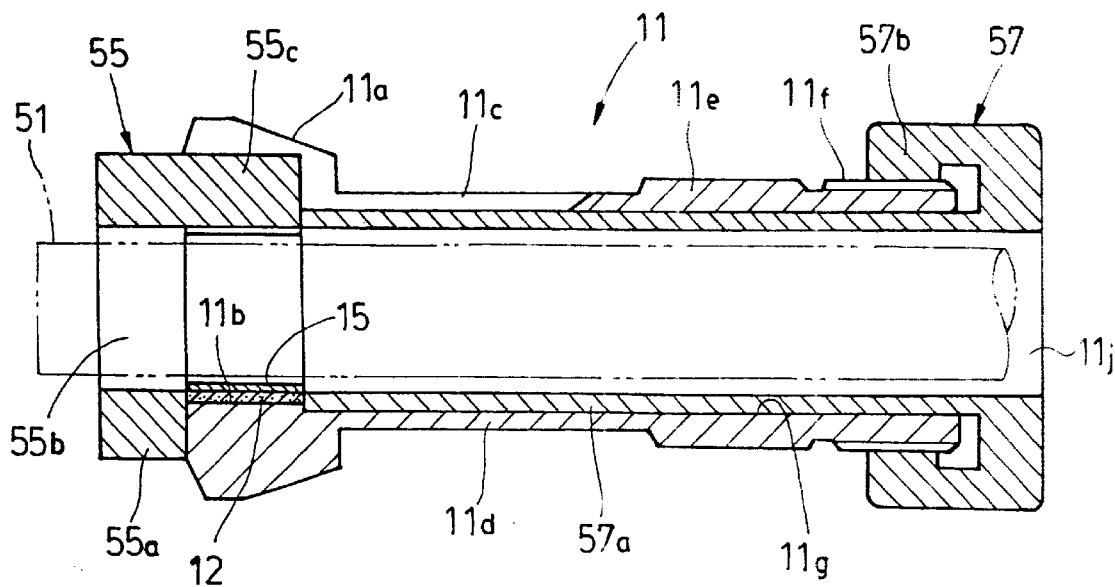
FIG. 28 is a longitudinal sectional view of a guide bush combined with the ringlike jig with projections and the cylindrical plug-in jig.

Both the ringlike jig 55 shown in FIG. 24 and the plug-in jig 57 shown in FIG. 25 may be put on the guide bush 11 as shown in FIG. 28 when forming the hard carbon film 15. The synergetic effects of the ringlike jig 55 and the plug-in jig 57 further improves the adhesion to the guide bush 11, and the quality and the thickness of the hard carbon film.

The ringlike jig 55 and the plug-in jig 57 are formed of a metal, such as a stainless steel.

The dummy member 53 and the plug-in jig 57 may be used in combination for forming a hard carbon film on the guide bush 11.

Although the foregoing hard carbon film forming methods embodying the present invention have been described as applied to forming the hard carbon film 15 on the surface of the superhard lining 12, those hard carbon film forming methods may be applied to forming the hard carbon film 15 directly on the inner surface 11b of the guide bush 11 not provided with the superhard lining 12, forming the hard carbon film 15 on the intermediate layer 16 formed on the inner surface 11b of the guide bush 11, or forming the hard carbon film 15 on the intermediate layer 16 formed on the surface of the superhard lining 12 attached to the inner surface 11b of the guide bush 11.

Although the foregoing hard carbon film forming methods embodying the present invention use methane ($CH_4$) gas or benzene ($C_6H_6$) gas as a gas containing carbon, the hard carbon film forming methods may use ethylene ($C_2H_4$), hexane ($C_6H_{14}$) or the like.

These gases containing carbon may be diluted by an inert gas that is ionized at a relatively low ionization potential, such as argon (Ar) to stabilize the plasma produced in the center bore of the guide bush.

A small amount of an additive (1% or less) may be added to the gas containing carbon for forming the hard carbon film to enhance lubricity or hardness.

Addition of, for example, fluorine (F) or boron (B) to the gas containing carbon increases lubricity. Addition of, for example, chromium (Cr), molybdenum (Mo) or tungsten (W) to the gas containing carbon increases hardness.

It is desirable to produce a plasma of argon (Ar) or nitrogen ($N_2$) after placing the guide bush in the vacuum vessel prior to forming the hard carbon film to bombard the inner surface of the guide bush, and to produce a plasma of the gas containing carbon, such as methane gas or benzene gas, for forming the hard carbon film.

This pretreatment using bombardment with an inert gas increases the temperature of the inner surface of the guide bush, activates the inner surface and drives out impurities from the inner surface of the guide bush to clean the inner surface. These effects further improve the adhesion of the hard carbon film to the inner surface of the hard carbon film.

INDUSTRIAL APPLICABILITY

As is apparent from the foregoing description, the use of the guide bush of the present invention on the rotary or the stationary guide bush device of an automatic lathe enables the automatic lathe to carry out the normal machining of a workpiece at an increased depth of cut without damaging the workpiece or causing seizure between the guide bush and the workpiece, and enhances the machining efficiency of the automatic lathe remarkably. The remarkably enhanced durability of the guide bush extends time for which machining can be continued, which increases the operation rate of the automatic lathe remarkably. When the guide bush is incorporated into the stationary guide bush device of an automatic lathe, the automatic lathe is able to achieve precision machining (particularly in roundness) efficiently.

The hard carbon film forming method for forming a hard carbon film on the inner surface of a guide bush is capable of forming a hard carbon film (DLC film) having uniform thickness and properties closely similar to those of diamond over the inner surface of a guide bush that is brought into sliding contact with a workpiece in a high adhesion in a short time.

Thus, the hard carbon film forming method is capable of manufacturing a durable guide bush for use on the guide bush device of an automatic lathe at a high productivity.

What is claimed is:

1. A method of forming a hard carbon film over the inner surface of a guide bush, comprising steps of:
    placing a guide bush for an automatic lathe in a vacuum vessel having a gas inlet port and a evacuation port;
    inserting a rod-shaped or wire-shaped auxiliary electrode in the center bore of the guide bush having an inner surface to be brought into sliding contact with a workpiece; and
    producing a plasma in the vacuum vessel by supplying a gas containing carbon through the gas inlet port into the vacuum vessel after evacuating the vacuum vessel and applying a radio frequency voltage to the guide bush to form the hard carbon film over the inner surface of the guide bush.

2. A method of forming a hard carbon film over the inner surface of a guide bush according to claim 1, wherein the auxiliary electrode is maintained at a ground potential or a positive DC potential, during the hard carbon film formation.

3. A method of forming a hard carbon film over the inner surface of a guide bush according to claim 1, wherein a ring-shaped dummy member having an inside diameter substantially equal to the diameter of the inner surface of the guide bush is put on an end face of the guide bush on the side of portion of the guide bush provided with slits when forming the hard carbon film.

4. A method of forming a hard carbon film over the inner surface of a guide bush according to claim 3, wherein the auxiliary electrode is disposed so that its extremity is at a distance inside the dummy member from the end face of the dummy member.

5. A method of forming a hard carbon film over the inner surface of a guide bush according to claim 1, wherein a ring-shaped jig having a ring-shaped body having an inside diameter substantially equal to the diameter of the inner surface of the guide bush, and plurality of projections capable of being inserted in the slits of the guide bush is put on an end face of the guide bush on a side portion of the guide bush provided with the slits with the projections inserted in the slits, respectively, when forming the hard carbon film.

6. A method of forming a hard carbon film over the inner surface of a guide bush according to claim 1, wherein a cylindrical plug-in jig having an inside diameter substantially equal to the diameter of the inner surface of the guide bush is fitted in an expanded section of the center bore of the guide bush, having a diameter greater than that of the inner surface when forming the hard carbon film.

7. A method of forming a hard carbon film over the inner surface of a guide bush according to claim 1, wherein a ring-shaped jig having a ring-shaped body having an inside diameter substantially equal to the diameter of the inner surface of the guide bush, and a plurality of projections capable of being inserted in the slits of the guide bush is put on an end face of the guide bush on the side of a portion of the guide bush provided with the slits with the projections inserted in the slits, respectively, and
    a cylindrical plug-in jig having an inside diameter substantially equal to the diameter of the inner surface of the guide bush is fitted in an expanded section of the center bore of the guide bush, having a diameter greater than that of the inner surface when forming the hard carbon film.

8. A method of forming a hard carbon film over the inner surface of a guide bush according to claim 1, wherein the auxiliary electrode is supported on an insulator inserted in an expanded section of the center bore of the guide bush, having a diameter greater than that of the inner surface when forming the hard carbon film.

9. A method of forming a hard carbon film over the inner surface of a guide bush, comprising steps of:
    placing a guide bush for an automatic lathe in a vacuum vessel having a gas inlet port and a evacuation port;
    inserting a rod-shaped or wire-shaped auxiliary electrode in the center bore of the guide bush having an inner surface to be brought into sliding contact with a workpiece; and
    producing a plasma in the vacuum vessel by supplying a gas containing carbon through the gas inlet port into the vacuum vessel after evacuating the vacuum vessel and applying a DC voltage to the guide bush to form the hard carbon film over the inner surface of the guide bush.

10. A method of forming a hard carbon film over the inner surface of a guide bush according to claim 9, wherein the auxiliary electrode is maintained at a ground potential or a positive DC potential, during the hard carbon film formation.

11. A method of forming a hard carbon film over the inner surface of a guide bush according to claim 9, wherein a ring-shaped dummy member having an inside diameter substantially equal to the diameter of the inner surface of the guide bush is put on an end face of the guide bush on the side of a portion of the guide bush provided with slits when forming the hard carbon film, during the hard carbon film formation.

12. A method of forming a hard carbon film over the inner surface of a guide bush according to claim 11, wherein the auxiliary electrode is disposed so that its extremity is at a distance inside the dummy member from the end face of the dummy member.

13. A method of forming a hard carbon film over the inner surface of a guide bush according to claim 9, wherein a ring-shaped jig having a ring-shaped body having an inside diameter substantially equal to the diameter of the inner surface of the guide bush, and a plurality of projections capable of being inserted in the slits of the guide bush is put on an end face of the guide bush on a side of a portion of the guide bush provided with the slits with the projections inserted in the slits, respectively, when forming the hard carbon film.

14. A method of forming a hard carbon film over the inner surface of a guide bush according to claim 9, wherein a cylindrical plug-in jig having an inside diameter substantially equal to the diameter of the inner surface of the guide bush is fitted in an expanded section of the center bore of the guide bush, having a diameter greater than that of the inner surface when forming the hard carbon film.

15. A method of forming a hard carbon film over the inner surface of a guide bush according to claim 9, wherein a ring-shaped jig having a ring-shaped body having an inside diameter substantially equal to the diameter of the inner surface of the guide bush, and a plurality of projections capable of being inserted in the slits of the guide bush is put on an end face of the guide bush on a side of a portion of the guide bush provided with the slits with the projections inserted in the slits, respectively, and
    a cylindrical plug-in jig having an inside diameter substantially equal to the diameter of the inner surface of the guide bush is fitted in an expanded section of the center bore of the guide bush, having a diameter greater than that of the inner surface when forming the hard carbon film.

16. A method of forming a hard carbon film over the inner surface of a guide bush according to claim 9, wherein the auxiliary electrode is supported on an insulator inserted in an expanded section of the center bore of the guide bush, having a diameter greater than that of the inner surface when forming the hard carbon film.

* * * * *